US011908823B2

(12) United States Patent
Orejola et al.

(10) Patent No.: US 11,908,823 B2
(45) Date of Patent: Feb. 20, 2024

(54) DEVICES INCORPORATING STACKED BONDS AND METHODS OF FORMING THE SAME

(71) Applicant: Wolfspeed, Inc., Durham, NC (US)

(72) Inventors: Erwin Orejola, Gilroy, CA (US); Brian Condie, Gilroy, CA (US); Ulf Andre, Hillsborough, NC (US)

(73) Assignee: Wolfspeed, Inc., Durham, NC (US)

( * ) Notice: Subject to any disclaimer, the term of this patent is extended or adjusted under 35 U.S.C. 154(b) by 256 days.

(21) Appl. No.: 17/145,794

(22) Filed: Jan. 11, 2021

(65) Prior Publication Data

US 2022/0223559 A1 Jul. 14, 2022

(51) Int. Cl.
*H01L 23/00* (2006.01)
*H01L 23/66* (2006.01)

(52) U.S. Cl.
CPC ............. *H01L 24/46* (2013.01); *H01L 24/05* (2013.01); *H01L 2924/1423* (2013.01)

(58) Field of Classification Search
CPC ............... H01L 24/46; H01L 24/05–10; H01L 2924/1423; H01L 2223/6683; H01L 23/66; H01L 2223/6611; H01L 24/45; H01L 24/48–49; H01L 24/85
USPC .................................. 257/773; 438/618, 666
See application file for complete search history.

(56) References Cited

U.S. PATENT DOCUMENTS

| | | | |
|---|---|---|---|
| 2007/0040252 A1 | 2/2007 | Hosseini | |
| 2007/0215993 A1* | 9/2007 | Chen | H01L 24/85 257/E23.125 |
| 2013/0285239 A1* | 10/2013 | Wu | H01L 24/85 257/E21.511 |
| 2015/0364816 A1* | 12/2015 | Murugan | H01L 23/66 257/664 |
| 2017/0271497 A1 | 9/2017 | Fayed et al. | |

FOREIGN PATENT DOCUMENTS

| | | |
|---|---|---|
| DE | 102008001671 A1 | 11/2009 |
| JP | 2001237263 A | 8/2001 |

OTHER PUBLICATIONS

Notification of Transmittal of the International Search Report and the Written Opinion of the International Searching Authority, or the Declaration, in corresponding PCT Application No. PCT/US2022/011261 (dated May 12, 2022).

\* cited by examiner

*Primary Examiner* — Didarul A Mazumder
(74) *Attorney, Agent, or Firm* — Myers Bigel, P.A.

(57) ABSTRACT

A packaged semiconductor device includes a first bond pad, a second bond pad, a first bond wire that includes a first end bonded to the first bond pad and a second end bonded to the second bond pad, and a second bond wire that includes a first end that is electrically connected to the first bond pad and a second end that is electrically connected to the second bond pad. The first end of the second bond wire is bonded to the first end of the first bond wire. A method of bonding a bond wire includes bonding a first end of a first bond wire to a contact surface of a first bond pad and bonding a first end of a second bond wire to a surface of the first end of the first bond wire.

37 Claims, 19 Drawing Sheets

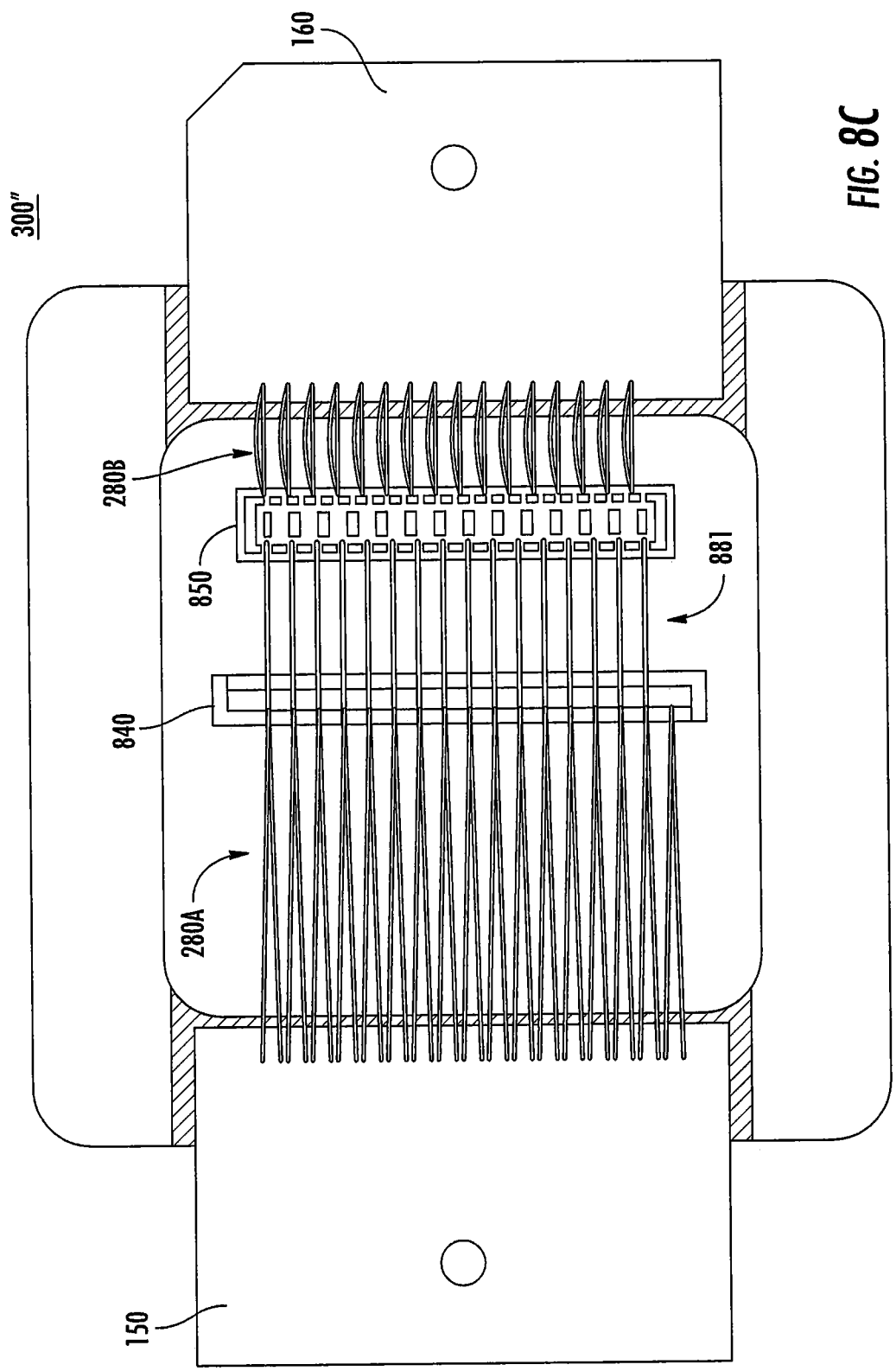

DEVICES INCORPORATING STACKED BONDS AND METHODS OF FORMING THE SAME

FIELD

The present disclosure is directed to integrated circuit devices, and more particularly, to structures for integrated circuit device packaging.

BACKGROUND

Electrical circuits requiring high power handling capability while operating at high frequencies, such as traditional cellular communication frequency bands (0.5-2.7 (GHz), S-band (3 GHz), X-band (10 GHz), Ku-band (12-18 GHz), K-band (18-27 GHz), Ka-band (27-40 GHz) and V-band (40-75 GHz) have become more prevalent. In particular, there is now high demand for RF transistor amplifiers that are used to amplify RF signals at frequencies of; for example, 500 MHz and higher (including microwave frequencies). These RF transistor amplifiers often need to exhibit high reliability, good linearity and handle high output power levels.

RF transistor amplifiers may be implemented in silicon or wide bandgap semiconductor materials, such as silicon carbide ("SiC") and Group III nitride materials. Herein, the term "wide bandgap" refers to semiconductor materials having a bandgap of greater than 1.40 eV. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

Silicon-based RF transistor amplifiers are typically implemented using laterally diffused metal oxide semiconductor ("LDMOS") transistors. Silicon LDMOS RF transistor amplifiers can exhibit high levels of linearity and may be relatively inexpensive to fabricate. Group III nitride-based RF transistor amplifiers are typically implemented as High Electron Mobility Transistors ("HEMT") and are primarily used in applications requiring high power and/or high frequency operation where LDMOS RF transistor amplifiers may have inherent performance limitations.

Packaged RF transistor amplifiers may also be implemented as monolithic microwave integrated circuits (MMIC). A MMIC refers to an integrated circuit that operates on radio and/or microwave frequency signals in which all of the circuitry for a particular function is integrated into a single semiconductor chip. An example MMIC device is a transistor amplifier that includes associated matching circuits, feed networks and the like that are all implemented on a common substrate. MMIC RF transistor amplifiers typically include a plurality of unit cell transistors that are connected in parallel. MMICs may also include surface-mount devices, integrated subcomponents, and grounding structures. The devices may be electrically interconnected using a variety of techniques.

Microstrip and coplanar transmission lines are examples of planar transmission lines often used in MMICs. In a microstrip transmission line, a center conductor is separated from a ground plane by a selected thickness of dielectric material to obtain a characteristic impedance of the transmission line. Fifty ohms is an example of a characteristic impedance often used in MMICs. In a coplanar transmission line, ground planes extend along each side of a center conductor to obtain a characteristic impedance. In both cases, center conductors of adjacent transmission lines are typically connected together using a type of wire bonding.

Wire bonding is widely used in the microelectronic fabrication industry, and provides a cost effective and flexible interconnect technology. Bond wires may comprise aluminum, copper, silver and/or gold. Wire bond attachment techniques may include ball bonding, wedge bonding and/or compliant bonding. In ball bonding and wedge bonding, the wire is attached at both ends using some combination of heat, pressure and ultrasonic energy to make a weld. In compliant bonding, heat and pressure is transmitted through a compliant or indentable aluminum tape.

SUMMARY

According to some embodiments described herein, a packaged semiconductor device includes a first bond wire comprising a first end and a second end and a second bond wire comprising a first end and a second end. The first end of the second bond wire is bonded to a surface of the first end of the first bond wire.

In some embodiments, the second end of the second bond wire is bonded to a surface of the second end of the first bond wire.

In some embodiments, the second end of the second bond wire is bonded to a contact surface of a pad.

In some embodiments, the second end of the first bond wire is bonded to the contact surface of the pad, and the second end of the first bond wire is separated from the second end of the second bond wire.

In some embodiments, the second bond wire comprises a round wire comprising a predominantly round cross-section.

In some embodiments, the first bond wire comprises a round wire comprising a predominantly round cross-section.

In some embodiments, the first bond wire comprises a wire ribbon comprising a predominantly rectangular cross-section.

In some embodiments, the first bond wire comprises a first bonding portion that is bonded to a contact surface of a pad, and the second bond wire comprises a second bonding portion that is bonded to the first bonding portion of the first bond wire.

In some embodiments, a thickness of the first bonding portion of the first bond wire in a vertical direction is smaller than a thickness of the second bonding portion of the second bond wire in the vertical direction.

In some embodiments, a width of the first bonding portion of the first bond wire in a horizontal direction is smaller than a thickness of the second bonding portion of the second bond wire in the horizontal direction.

In some embodiments, greater than twenty-five percent of a circumference of the second bond wire contacts the surface of the first end of the first bond wire or greater than twenty-five percent of a circumference of the first bond wire contacts a surface of the second bond wire.

In some embodiments, the packaged semiconductor device further includes a third bond wire comprising a first end and a second end, and the second end of the third bond wire is bonded to the second end of the second bond wire.

In some embodiments, an operating frequency of the packaged semiconductor device is between 500 MHz and 75 GHz.

In some embodiments, the packaged semiconductor device further includes a monolithic microwave integrated circuit (MMIC).

In some embodiments, the packaged semiconductor device further includes a transistor amplifier integrated circuit.

According to some embodiments described herein, a packaged semiconductor device includes a first bond pad; a second bond pad; a first bond wire comprising a first end bonded to the first bond pad and a second and bonded to the second bond pad; and a second bond wire comprising a first end that is electrically connected to the first bond pad and a second end that is electrically connected to the second bond pad. The first end of the second bond wire is bonded to the first end of the first bond wire.

In some embodiments, the second end of the second bond wire is bonded to a surface of the second end of the first bond wire.

In some embodiments, the second end of the second bond wire is bonded to the second bond pad.

In some embodiments, the second end of the first bond wire is separated from the second end of the second bond wire.

In some embodiments, the second bond wire comprises a round wire comprising a predominantly round cross-section.

In some embodiments, the first bond wire comprises a round wire comprising a predominantly round cross-section.

In some embodiments, the first bond wire comprises a wire ribbon comprising a predominantly rectangular cross-section.

In some embodiments, the first bond wire and the second bond wire each comprise a wire ribbon comprising a predominantly rectangular cross-section.

In some embodiments, the first bond wire comprises a first bonding portion that is bonded to the first bond pad, and the second bond wire comprises a second bonding portion that is bonded to the first bonding portion of the first bond wire.

In some embodiments, a thickness of the first bonding portion of the first bond wire in a vertical direction is smaller than a thickness of the second bonding portion of the second bond wire in the vertical direction.

In some embodiments, a width of the first bonding portion of the first bond wire in a horizontal direction is smaller than a thickness of the second bonding portion of the second bond wire in the horizontal direction.

In some embodiments, greater than fifty percent of a lower surface of the second bond wire contacts an upper surface of the first bond wire or greater than fifty percent of the upper surface of the first bond wire contacts the lower surface of the second bond wire.

In some embodiments, the packaged semiconductor device further includes a third bond wire comprising a first end that is electrically connected to the first bond pad and a second end that is electrically connected to the second bond pad, and the second and of the third bond wire is bonded to the second end of the second bond wire.

In some embodiments, an operating frequency of the packaged semiconductor device is between 500 MHz and 75 GHz.

In some embodiments, the packaged semiconductor device further includes a monolithic microwave integrated circuit (MMIC).

In some embodiments, the packaged semiconductor device further includes a transistor amplifier integrated circuit.

In some embodiments, the packaged semiconductor device further includes an input lead, and the first bond pad is electrically coupled between the first bond wire and the input lead.

In some embodiments, the packaged semiconductor device further includes an input lead, and the second bond pad is electrically coupled between the first bond wire and the input lead.

In some embodiments, the packaged semiconductor device further includes comprising an output lead, and the first bond pad is electrically coupled between the first bond wire and the output lead.

In some embodiments, the packaged semiconductor device further includes an output lead, and the second bond pad is electrically coupled between the first bond wire and the output lead.

According to some embodiments described herein, a method of bonding a bond wire includes bonding a first end of a first bond wire to a contact surface of a first bond pad and bonding a first end of a second bond wire to a surface of the first end of the first bond wire.

In some embodiments, bonding the first end of the first bond wire to the contact surface of the first bond pad comprises placing the first end of the first bond wire on the contact surface and applying a first pressure to the first end of the first bond wire.

In some embodiments, bonding the first end of the second bond wire to the surface of the first end of the first bond wire comprises placing the first end of the second bond wire on the surface of the first end of the first bond wire and applying a second pressure to the first end of the second bond wire.

In some embodiments, the second pressure is less than the first pressure.

In some embodiments, the method further includes bonding a second end of the second bond wire to a surface of a second end of the first bond wire.

In some embodiments, the method further includes bonding a second end of the second bond wire to a contact surface of a second bond pad.

In some embodiments, the second end of the second bond wire is bonded at a point that is separated from the second and of the first bond wire.

In some embodiments, at least one of the first bond wire and the second bond wire comprises a round wire comprising a predominantly round cross-section.

In some embodiments, at least one of the first bond wire and the second bond wire comprises a wire ribbon comprising a predominantly rectangular cross-section.

In some embodiments, the method further includes bonding a third bond wire to a surface of a second and of the second bond wire.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIGS. 8A to 8E am schematic plan views of packaged FET-based power amplifiers according to some embodiments of the present disclosure.

DETAILED DESCRIPTION

Some embodiments of the present disclosure may arise from realization that a reduction in a size of contact pads and/or an increase in current-carrying capability may result from the use of stacked bonds. Stacked bonds may involve the sequential overlapping of bonding surfaces between adjacent ones of a plurality of bonding wires. A bonding portion of a second wire, for example, may be bonded to a top surface of the bonding portion of a first wire. By stacking bonds, an area of a contact pad may be reduced. The reduction in the area of the contact pad may further result in a reduction of parasitic components, as well as a reduction in overall size, of a resulting device, which may improve the performance of the device. In some embodiments, the use of stacked bonds may result in a same contact pad size, but with an increase in current carrying capability. Thus, by using stacked bonds the reliability and performance of the device may be maintained or improved, while maintaining or improving the device output.

Figure 1A:
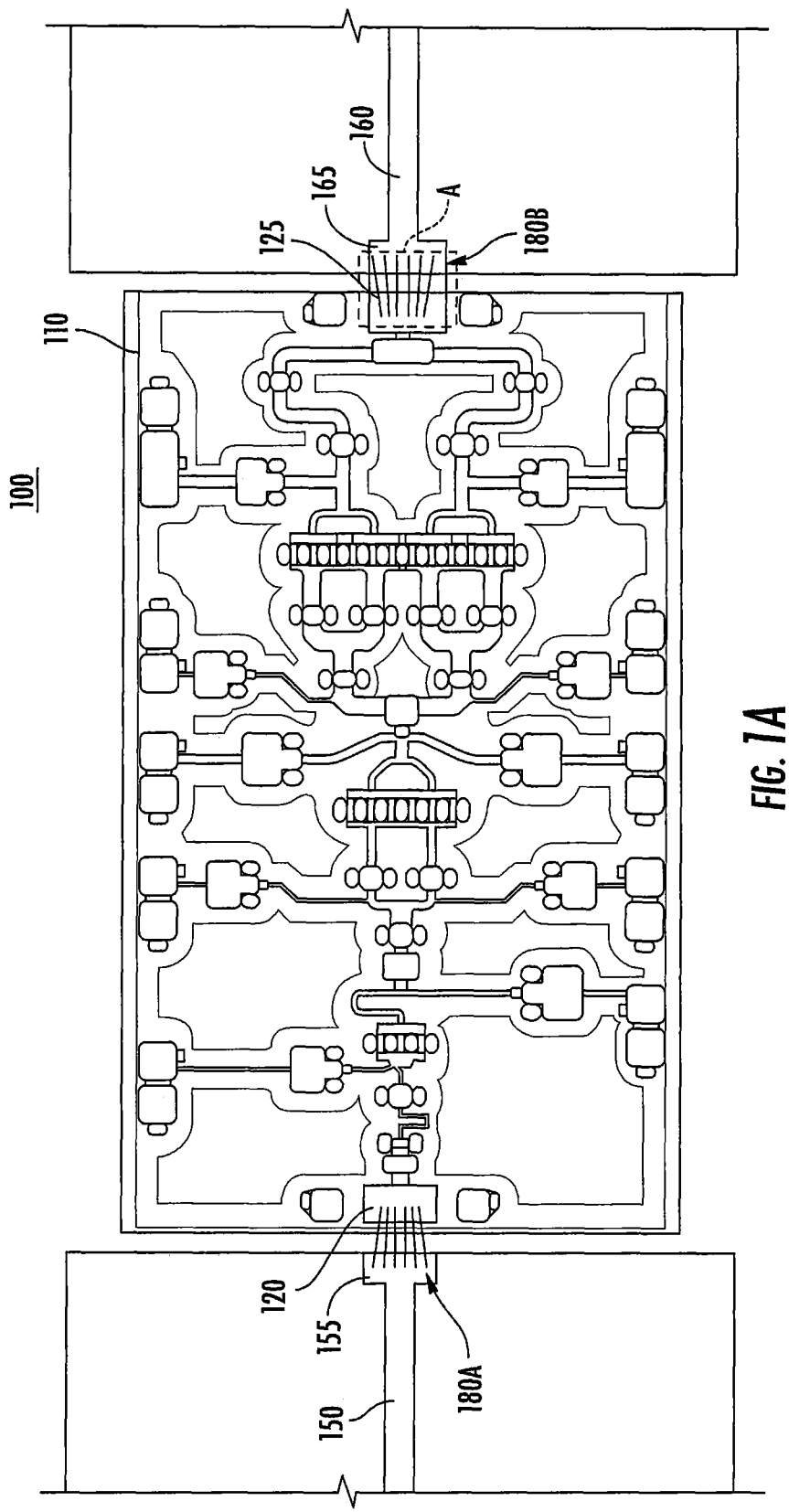
FIG. 1A is a schematic plan view of a portion of a conventional MMIC package.
Figure 1B:
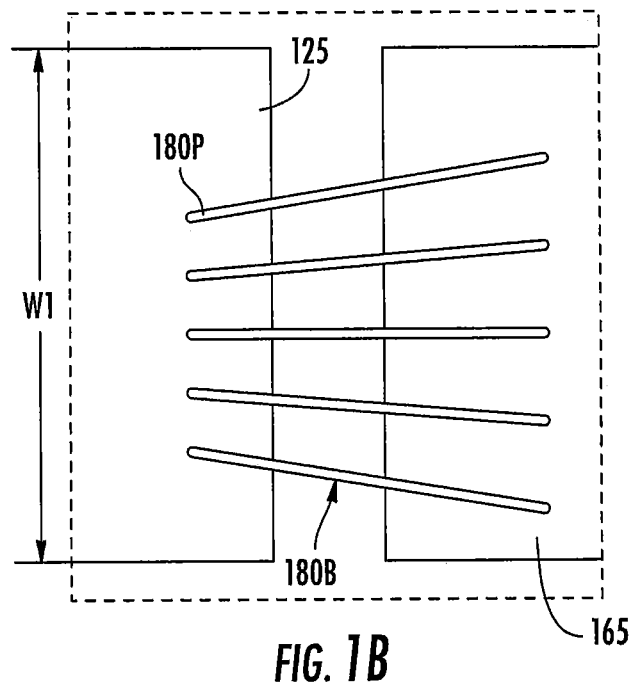
FIGS. 1B and 1C are schematic plan views of portion A of FIG. 1A.
Figure 1C:
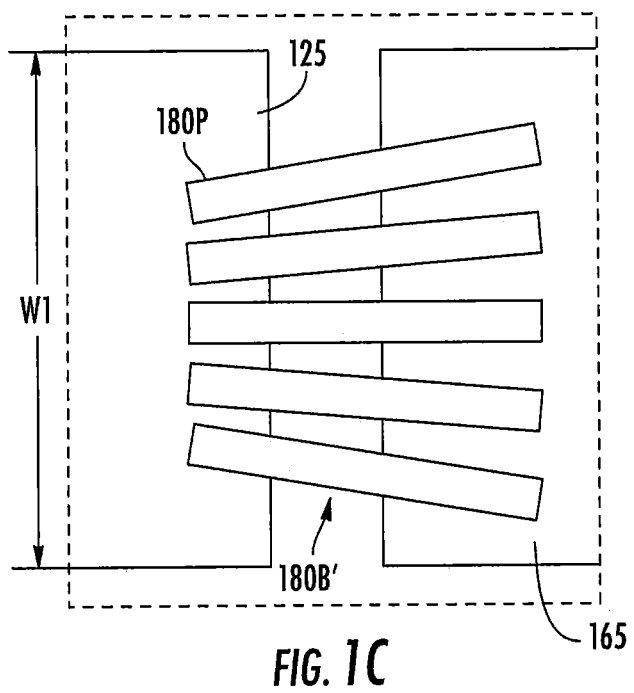

FIG. 1A is a schematic plan view of a portion of a conventional MMIC package 100. FIGS. 1B and 1C are schematic plan views of portion A of FIG. 1A. FIGS. 1A to 1C are exaggerated views for the purpose of illustration only and are not intended to represent the true scale and structure of an actual device.

The MMIC package 100 may include MMIC device 110. The MMC device 110 may include a number of transistors, circuit components, associated matching circuits, feed networks, and the like. The MMIC device 110 may include input pad 120 and output pad 125. The input pad 120 may be coupled to an input feed network of the MMIC device 110, and the output pad 125 may be coupled to an output feed network of the MMIC device 110. As an example, the input pad 120 and/or output 125 may be matched to a characteristic impedance of 50 ohms, e.g., by input and output matching circuits of the MMIC device 110.

The MMIC package 100 may further include an input lead 150 and an output lead 160. The input lead 150 may be configured to transmit an input signal provided to the MMIC package 100 (e.g., by an external input lead, not shown) to the input pad 120 of the MMIC device 110. Similarly, the output lead 160 may be configured to transmit an output signal that is provided by the output pad 125 of the MMIC device 110 to an output of the MMIC package 100 (e.g., by an external output lead, not shown).

The input lead 150 may have an input lead pad 155 and the output lead 160 may have an output lead pad 165. The input lead 150 and the output lead 160 may be part of an external submount onto which the MMIC device 110 is placed. Once placed, a connection between the input lead pad 155 and the input pad 120 and a connection between the output lead pad 165 and the output pad 125 may be made. For example, bond wires may be provided between the various pads. A plurality of bond wires 180A may be connected between a contact surface of the input lead pad 155 and a contact surface the input pad 120 and a plurality of bond wires 180B may be connected between a contact surface of the output lead pad 165 and a contact surface of the output pad 125.

Referring to FIG. 1B, opposing ends of each of the plurality of bond wires 180B may be respectively connected between a contact surface of the output lead pad 165 and a contact surface of the output pad 125. Opposing ends of the plurality of bond wires 180B may be respectively connected to the output lead pad 165 and/or the output pad 125 by ball and/or wedge bonding.

Ball bonding may be utilized with thermocompression and thermosonic joining methods. Thermocompression methods may utilize pressure and temperature (e.g., from about 150° C.) to create an intermetallic bond. Thermosonic methods may additionally include ultrasonic energy. With both methods, a ball may be created by a spark underneath the bonding device before bonding takes place. This ball may then get deformed when the bonding device touches the surface of the bond pad and applies force and/or ultrasonic energy to deform the ball.

Wedge bonding may utilize ultrasonic energy and pressure to create a bond between the wire and the bond pad. This connection process deforms the wire, e.g. into a flat elongated shape of a wedge. Unlike ball bonding, the initial bond between the wire and the bond pad for a wedge bond does not have a ball.

Types of bond wires 180A and 180B may vary. For example, the plurality of bond wires 180A and/or 180B may be round wires or may be wire ribbons. As used herein, "bond wire" may refer to both round wires and wire ribbons. FIG. 1C illustrates an example in which the plurality of bond wires 180B' are implemented as wire ribbons. A wire ribbon may differ from wires having a predominately round cross-section in that the wire ribbon may have a cross-section that is more rectangular. Wire ribbons may be used for bonding to take advantage of the so called "skin effect," which causes free electrons in a conductor to have a tendency to move along the surface ("skin") of the conductor. Wire ribbon may provide an advantage over round wire due to its relatively large surface area in proportion to the cross section area.

Respective ones of the plurality of bond wires 180B may have connection points 180P that are spaced apart from one another. In order to accommodate the connection points 180P, the output pad 125 may have a width W1. The width W1 of the output pad 125 creates a design tradeoff. One method of increasing the current-carrying capacity of the device includes increasing the number of bond wires 180B. However, increasing the number of bond wires 180B proportionally increases the size of the output pad 125 needed to accommodate the connection points 180P of the bond wires 180B. The size of the output pad 125, however, may contribute to parasitic components that can affect the operation of the device. These parasitic components may have an increased impact at higher frequencies.

Figure 2A:
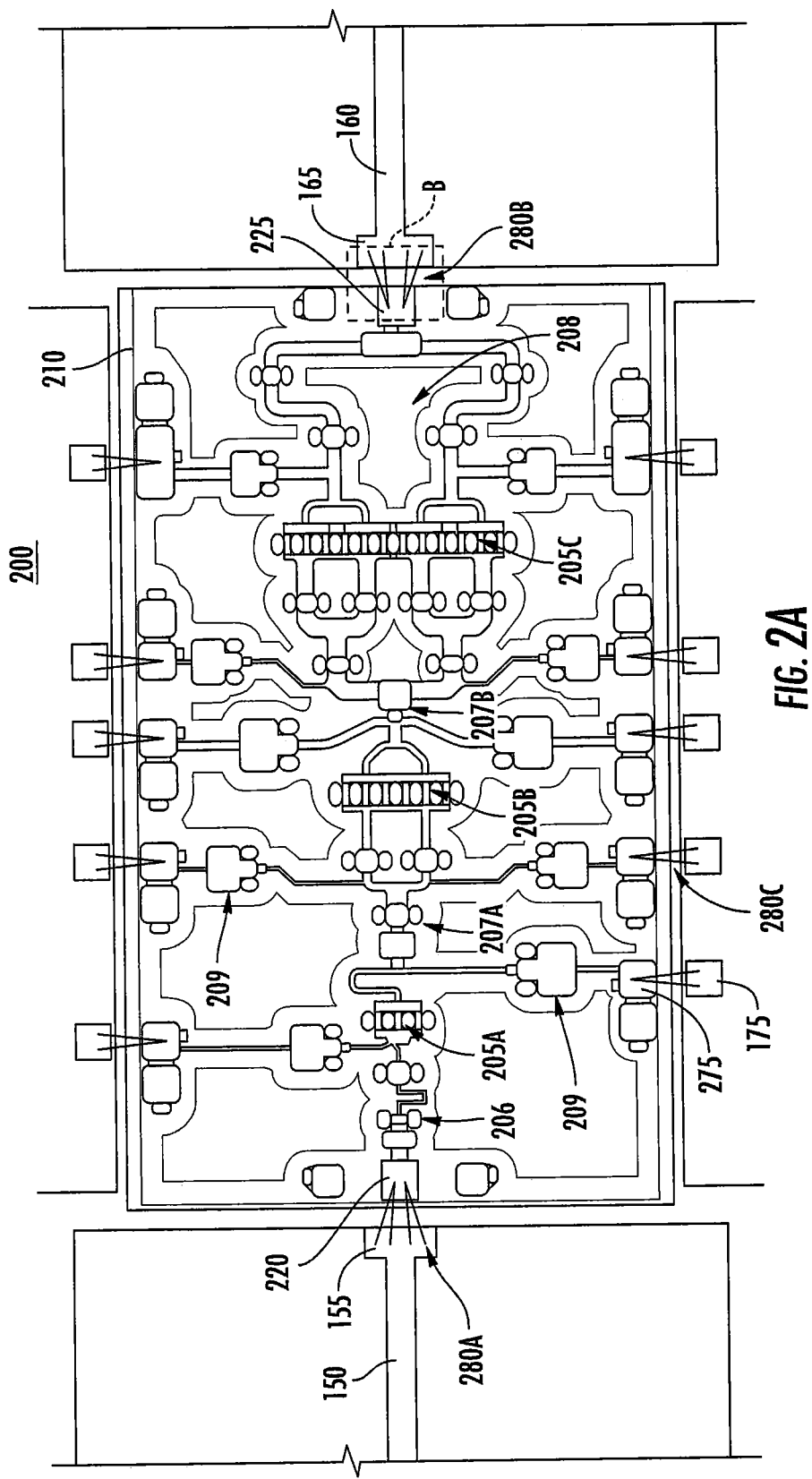
FIG. 2A is a schematic plan view of a portion of a MMIC package according to some embodiments of the present disclosure.
Figure 2B:
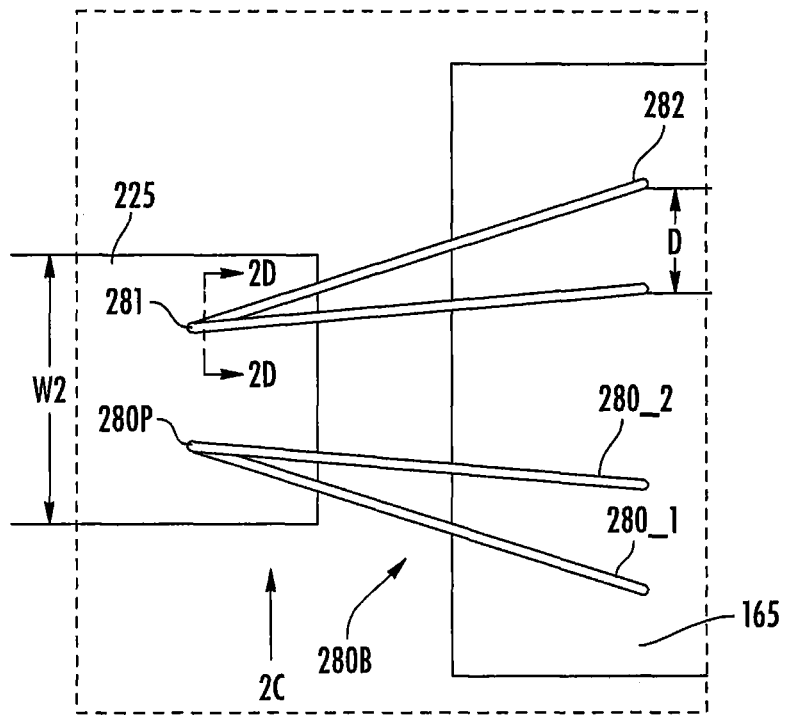
FIG. 2B is a schematic plan view of portion B of FIG. 2A.
Figure 2C:
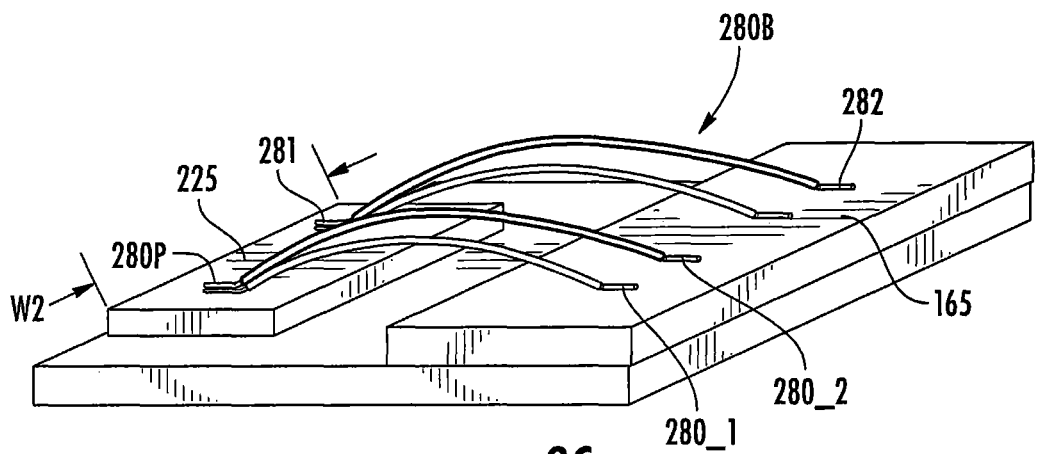
FIG. 2C is a perspective view taken generally from direction 2C of FIG. 2B.
Figure 2D:
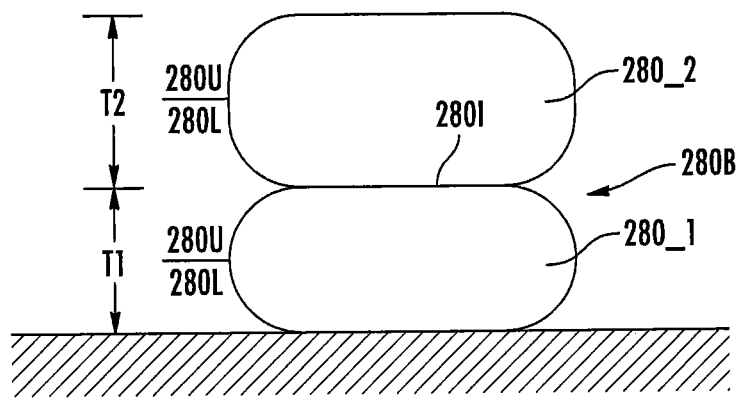
FIG. 2D is a cross-sectional view taken generally along line 2D-2D of FIG. 2B.
Figure 2E:
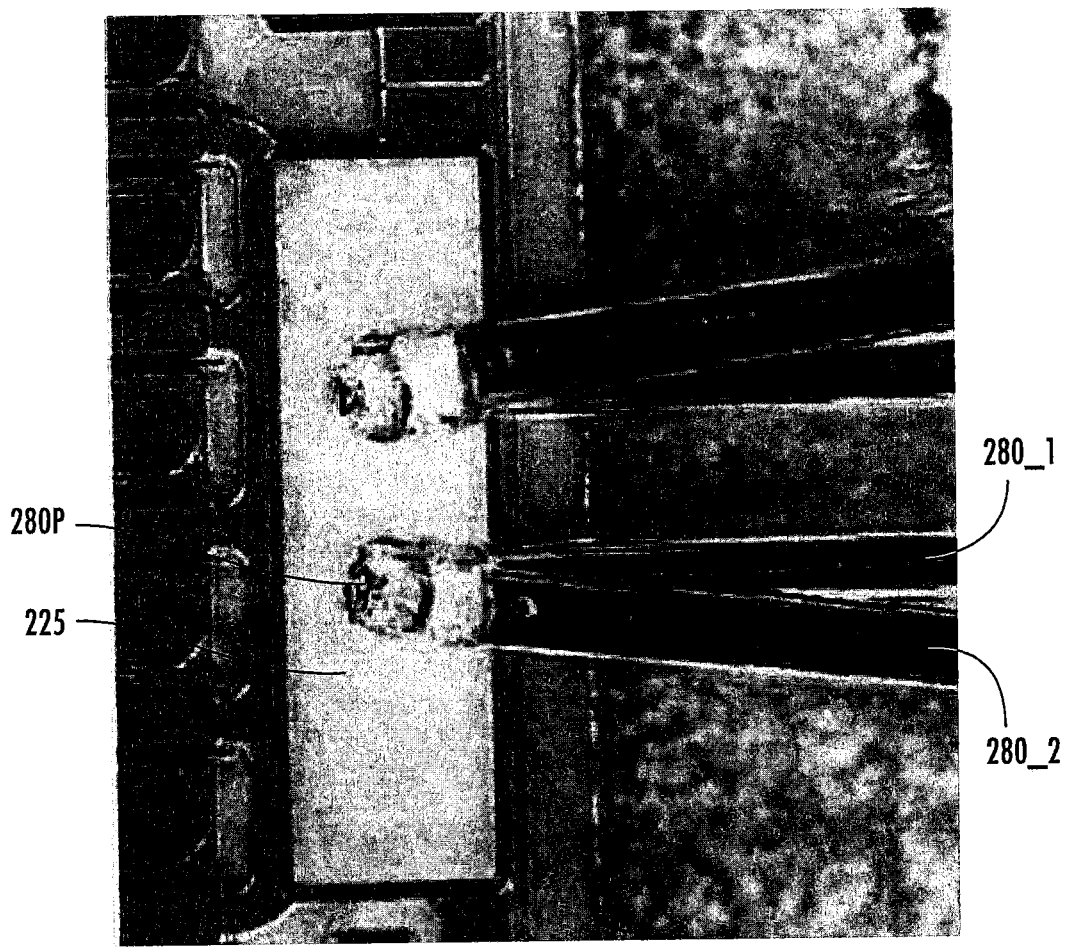
FIG. 2E is a photo of an example embodiment of the present disclosure.

FIG. 2A is a schematic plan view of a portion of a MMIC package 200 according to some embodiments of the present disclosure. FIG. 2B is a schematic plan view of portion B of FIG. 2A. FIG. 2C is a perspective view taken generally from direction 2C of FIG. 2B. FIG. 2D is a cross-sectional view taken generally along line 2D-2D of FIG. 2B. FIG. 2E is a photo of an example embodiment of the present disclosure. FIGS. 2A to 2D are exaggerated views for the purpose of illustration only and are not intended to represent the true scale and structure of an actual device. As FIGS. 2A to 2E include elements of a MMIC package 200 that are the same or similar to those of the MMIC package 100 described with respect to FIGS. 1A to 1C, a duplicate description thereof will be omitted for the sake of brevity. Instead, the discussion of FIGS. 2A to 2E will focus primarily on the differences between the implementations.

The MMIC package 200 may include MMIC device 210. The MMIC device 210 may include a number of transistors, circuit components, associated matching circuits, feed networks, and the like. For example, the MMIC device 210 may include multiple stages, such as a first stage 205A, a second stage 205B, and/or a third stage 205C. Each of the stages 205A, 205B, 205C may contain, for example, one or more transistors. The number and configuration of the stages 205A, 205B, 205C are merely illustrated in FIG. 2A as examples, and are not intended to limit the scope of the present disclosure. The MMIC device 210 may also include various matching circuits. For example, the MMIC device 210 may include an input stage matching circuit 206, one or more interstage matching circuits 207A, 207B, and/or an output stage matching circuit 208. The MMIC device 210 may also include one or more biasing circuits 209.

The MMIC device 210 may include input pad 220 and output pad 225. The input pad 220 may be coupled to an input feed network of the MMIC device 210, and the output pad 225 may be coupled to an output feed network of the MMIC device 210. As an example, the input pad 220 and/or output pad 225 may be matched to a characteristic impedance of 50 ohms, e.g., by input and output matching circuits of the MMIC device 210.

The MMC package 200 may further include an input lead 150 and an output lead 160. The input lead 150 may be configured to transmit an input signal provided to the MMIC package 200 (e.g., by an external input lead, not shown) to the input pad 220 of the MMIC device 210. Similarly, the output lead 160 may be configured to transmit an output signal that is provided by the output pad 225 of the MMIC device 210 to an output of the MMC package 200 (e.g., by an external output lead, not shown).

The MMC package 200 may include a connection between an input lead pad 155 of the input lead 150 and the input pad 220 and a connection between an output lead pad 165 of the output lead pad 165 and the output pad 225. A plurality of bond wires 280A may be connected between the input lead pad 155 and the input pad 220 and a plurality of bond wires 280B may be connected between the output lead pad 165 and the output pad 225.

Referring to FIGS. 2B to 2D, the plurality of bond wires 280A and/or 280B may include groups of two or more bond wires 280 that are stacked upon one another. For example, a first bond wire 280_1 may be connected (e.g., bonded) directly to a contact surface of the output pad 225. A bottom surface of the second bond wire 280_2 may be connected (e.g., bonded) to a top surface of the first bond wire 280_1. Thus, an interface 280I may be formed between the first bond wire 280_1 and the second bond wire 280_2.

Referring to FIGS. 2B and 2C, each of the plurality of bond wires 280B may have opposing ends including a first end 281 and a second end 282. In some embodiments, the first ends 281 of ones of the plurality of bond wires 280B may be stacked on the first ends 281 of other ones of the plurality of bond wires 280B. The second ends 282 of respective ones of the plurality of bond wires 280B may be spaced apart from the other second ends 282 of the plurality of bond wires 280B. That is to say that each of the plurality of bond wires 280B may be stacked on one side of the bond wire, but may be bonded separately from one another on the other side of the bond wire. In some embodiments, adjacent second ends 282 of the plurality of bond wires 280B may be spaced apart from one another by a distance D. Adjusting the distance D may impact the mutual inductance between respective ones of the plurality of bond wires 280B. Thus, by "fanning out" (e.g., increasing the distance D between respective ones of the plurality of bond wires 280B, a mutual inductance between the plurality of bond wires 280B may be reduced, which can favorably impact the performance of the MMIC package 200.

Though FIGS. 2A to 2E illustrate the first ends 281 (e.g., the "stacked" ends) of the plurality of bond wires 280B on the output pad 225 and the second ends 282 (e.g., the "fanned out" ends) of the plurality of bond wires 280B on the output lead pad 165, the present inventive concepts are not limited thereto. In some embodiments, the first ends 281 (e.g., the "stacked" ends) of the plurality of bond wires 280B may be bonded to the output lead pad 165 and the second ends 282 (e.g., the "fanned out" ends) of the plurality of bond wires 280B may be bonded to on the output pad 225.

Referring to FIG. 2D, in some embodiments, the interface 280I between the first bond wire 280_1 and the second bond wire 280_2 may provide a physical and/or electrical connection between the second bond wire 280_2 and the input pad 220. In some embodiments, the interface 280I between the first bond wire 280_1 and the second bond wire 280_2 may extend over twenty-five percent of the circumference of the first bond wire 280_1 and/or the circumference of the second bond wire 280_2. In some embodiments, the interface 280I between the first bond wire 280_1 and the second bond wire 280_2 may extend over fifty percent of the upper circumference of the first bond wire 280_1 and/or the lower circumference of the second bond wire 280_2. Stated another way, the circumference of the first bond wire 280_1 and/or the second bond wire 280_2 may be divided into an upper half 280U and a lower half 280L according to a horizontal line through the first bond wire 280_1 and/or the second bond wire 280_2. In some embodiments over fifty percent of the upper half 280U of the circumference of the first bond wire 280_1 and over fifty percent of the lower half 280L of the circumference of the second bond wire 280_2 may be in contact with one another. In some embodiments, over seventy-five percent of the upper half 280U of the circumference of the first bond wire 280_1 and over seventy-five percent of the lower half 280L of the circumference of the second bond wire 280_2 may be in contact with one another. These contact percentages are merely examples, and the embodiments of the present disclosure are not solely limited to these examples.

In some embodiments, the process of attaching the first bond wire 280_1 to the output pad 225, which may include the use of downward pressure, may decrease a thickness T1 (e.g., in a vertical direction) of the portion of the first bond wire 280_1 that contacts the output pad 225. In addition, the process of attaching the second bond wire 280_2 to the first bond wire 280_1 may decrease a thickness T2 (e.g., in a vertical direction) of the portion of the second bond wire 280_2 that contacts the first bond wire 280_1 as well as the portion of the first bond wire 280_1 that contacts the output pad 225. In other words, the portion of the first bond wire 280_1 that contacts the output pad 225 may undergo a downward pressure at least two times: a first time when the first bond wire 280_1 is bonded to the output pad 225 and a second time when the second bond wire 280_2 is bonded to the first bond wire 280_1. As a result, the thickness T1 of the portion of the first bond wire 280_1 that contacts the output pad 225 may be smaller than the thickness T2 of the portion of the second bond wire 280_2 that contacts the first bond wire 280_1.

FIG. 2E is a photo illustrating the first bond wire 280_1 bonded in a stacked configuration with the second bond wire 280_2. In FIG. 2E, the two bond wires are wedge-bonded, but the embodiments of the present disclosure are not limited thereto.

Referring back to FIGS. 2B and 2C, the use of stacked bonds may reduce the number of connection points 280P on the output pad 225. For example, if the plurality of bond wires 280 includes n bond wires, and each of the plurality of bond wires 280A are stacked in pairs, the number of connection points 280P is n/2. This is half of the connection points that are present in the conventional device. The reduction in connection points 280P may result in the ability to reduce the width W2 of the output pad 225. Similarly, if the orientations of the bond wires 280B were reversed with the stacked bonds on the output lead pad 165, a width of the output lead pad 165 may be reduced. The reduction in the width W2 of the output pad 225 may result in both a reduction in parasitic components of the MMIC device 210 as well as a reduction in overall size. In some embodiments, the number of connection points 280P may remain the same, but the number of conductors may increase. For example, by stacking bond wires in pairs, the number of bond wires that may be provided may be doubled for the same number of connection points 280P and/or the same width W2 of the output pad 225.

Though FIGS. 2B to 2E focus on the implementation at the output pad 225, it will be understood that a similar configuration may be present between the input pad 220 and the input lead pad 155. Similarly, other bonding areas of the MMIC device 210 not expressly described may also use wire bonding (e.g., for biasing) that may be connected using stacked wire bonds in a manner similar to that illustrated in FIGS. 2A to 2E.

For example, referring to FIG. 2A, the MMIC device 200 may include package bias pads 175. The package bias pads 275 may be configured to be coupled to device bias pads 275 on the MMIC device 200. In some embodiments, the package bias pads 275 may be configured to be coupled to device bias pads 275 via an additional plurality of bond wires 280C. In some embodiments, the package bias pads 275 and the device bias pads 275 may be configured to provide a bias signal, such as a DC signal, to the MMIC device 200. As with the plurality of bond wires 280A and 280B described herein, the plurality of bond wires 280C between the package bias pads 275 and the device bias pads 275 may incorporate stacked bonding. The use of stacked bonds may allow for an increase in the current carrying capability (e.g., a DC current carrying capability) without needing a larger bond pad. The configuration of the stacked bond wires 280C illustrated in FIG. 2A is merely an example, and the bond wires 280C may configured in any of the stacked bond configurations described herein. As would be understood by one of ordinary skill in the art, the benefits of stacking wire bonds may be realized in any configuration using wire bonds.

Figure 3:
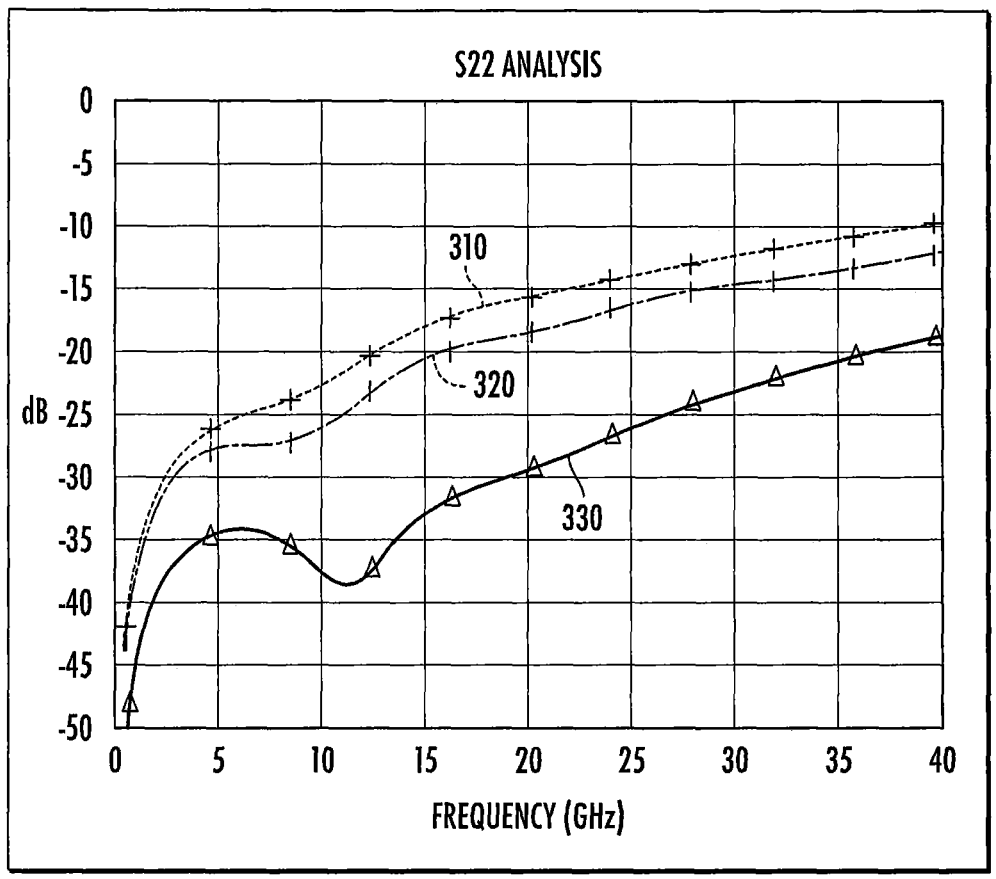
FIG. 3 is a graph illustrating a comparison of the performance of an example embodiment of the present invention to conventional devices.

FIG. 3 is a graph illustrating a comparison of the performance of an example embodiment of the present invention to conventional devices. FIG. 3 is a graph of S22 performance of example implementations using two conventional 2 mil bond wires (line 310), two 3×1 mil ribbon bond wires (line 320) and four 2 mil stacked bond wires stacked in pairs (line 330). As can be seen in FIG. 3, the S22 performance of the example illustrates improvements over all of the frequencies of operation. FIG. 3 is an example of a performance improvement that may be achieved when parasitic components associated with bond wires are reduced. The reduction in parasitic components associated with the bond wires that may be achieved with the stacked bond wire configurations described herein may result in improved S22 and S11 performance compare to conventional bonding. This may allow for a wider operational bandwidth for devices incorporating stacked bonds, as much less tuning is needed to compensate for the parasitic mismatch associated with the bond wires.

FIGS. 2A to 2E illustrate embodiments in which the plurality of bond wires 280B are grouped into stacked pairs, but the embodiments of the present disclosure are not limited to such a configuration. In some embodiments, the number of stacked bond wires may be larger than two.

Figure 4A:
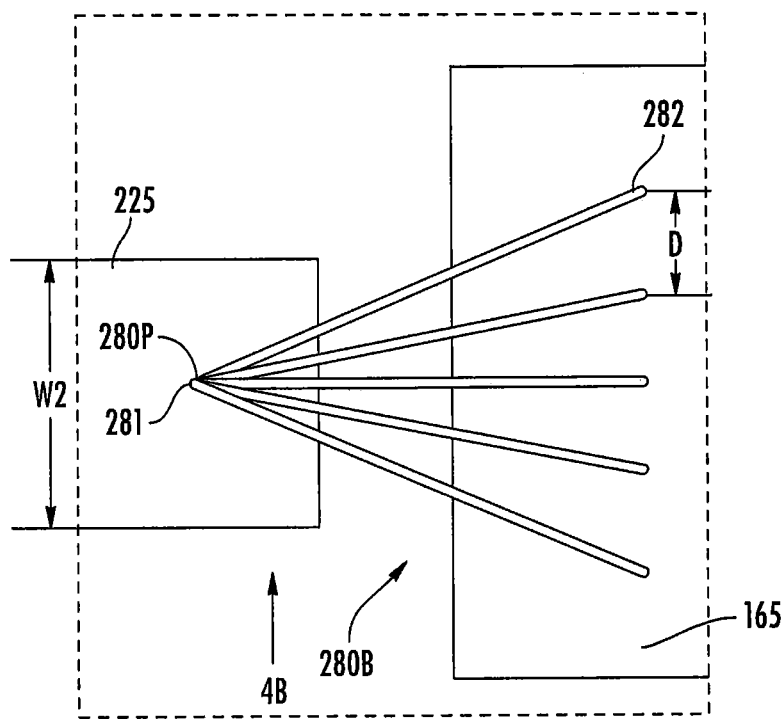
FIG. 4A is a schematic plan view.
Figure 4B:
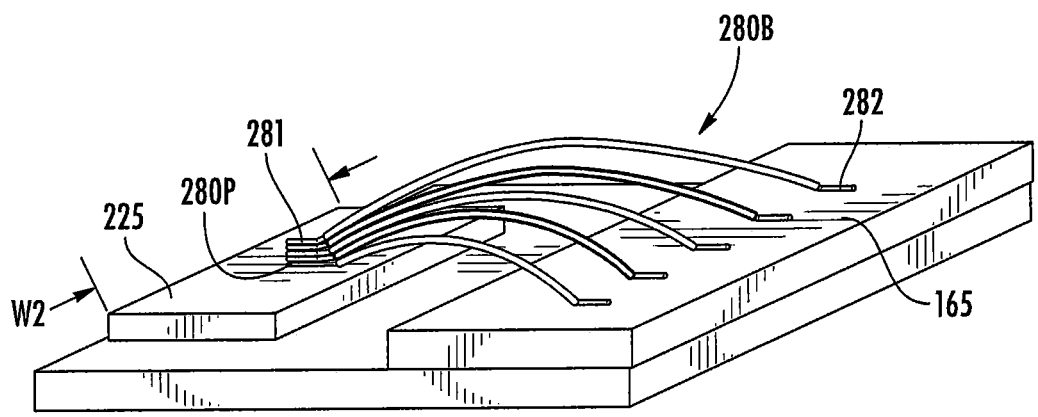
FIG. 4B is a schematic perspective view, of additional embodiments of the present disclosure.

For example, FIGS. 4A and 4B illustrate additional embodiments of the present disclosure in which five bond wires are stacked, as an example. FIG. 4A is a schematic plan view of an additional embodiment of the present disclosure of a similar area of the MMIC device 210 as was illustrated in FIG. 2B. FIG. 4B is a perspective view taken generally from direction 4B of FIG. 4A. A description of elements of FIGS. 4A and 4B that are the same or similar to those that have been previously described will be omitted for brevity.

As shown in FIG. 4A, in some embodiments, the first ends 281 of each of the plurality of bond wires 280B may be stacked on one another to form a single connection point 280P. In FIGS. 4A and 4B, five bond wires are illustrated as being stacked upon one another, but the embodiments of the present disclosure are not limited to such a configuration. Each of the second ends 282 of the plurality of bond wires 280B may be separated from one another by a distance D. In some embodiments, the distance D is not identical between respective ones of the second ends 282 of the plurality of bond wires 280B. For example, in some embodiments a first distance between the second ends 282 of a first pair of adjacent bond wires 280 may be different from a second distance between the second ends 282 of a second pair of adjacent bond wires 280.

In some embodiments, not all of the plurality of bond wires 280A, 280B may be stacked. For example, in some embodiments, some of the bond wires may be stacked on one another while others of the bond wires are not stacked. Thus, various combinations of stacked and non-stacked bond wires may be combined without deviating from the embodiments described herein.

In the embodiments of FIGS. 2A to 4B, the bond wires have been illustrated as being stacked on one side of the bond wire, but non-stacked on the other side of the bond wire. However, the embodiments of the present disclosure are not limited to such a configuration. For example, in some embodiments both sides of the bond wire may be in a stacked configuration.

Figure 5A:
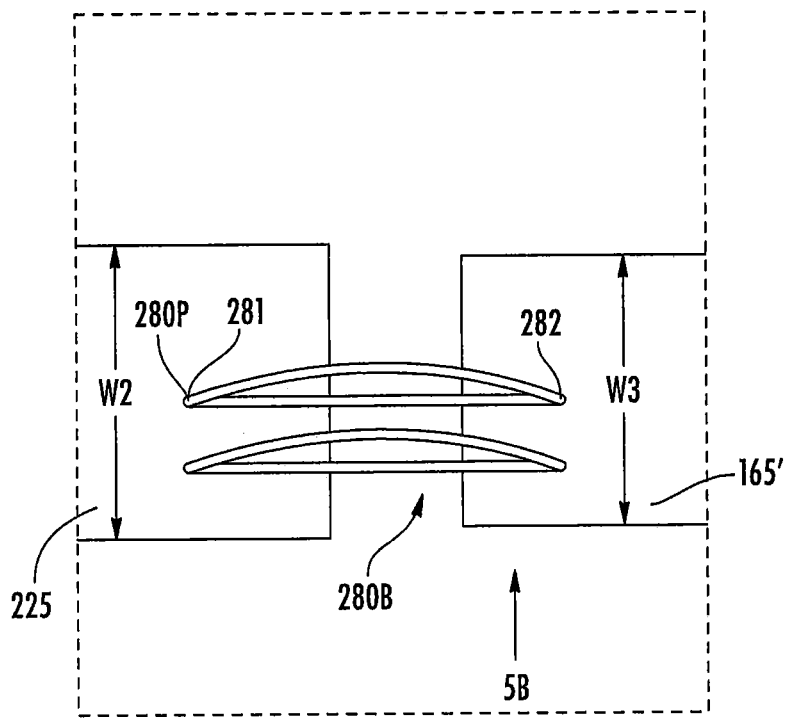
FIG. 5A is a schematic plan view.
Figure 5B:
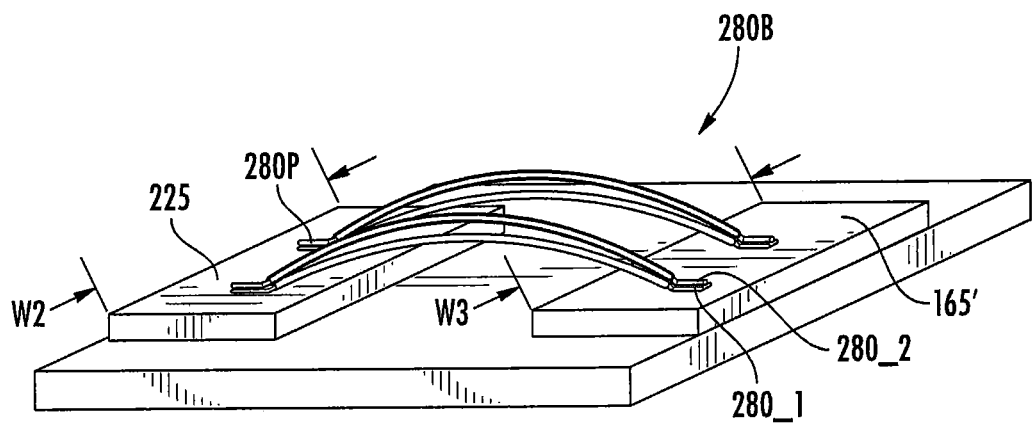
FIG. 5B is a schematic perspective view, of additional embodiments of the present disclosure.

FIGS. 5A and 5B illustrate additional embodiments of the present disclosure in which both sides of a pair of bond wires are stacked, as an example. FIG. 5A is a schematic plan view of an additional embodiment of the present disclosure of a similar area of the MMIC device 210 as was illustrated in FIG. 2B. FIG. 5B is a perspective view taken generally from direction 5B of FIG. 5A. A description of elements of FIGS. 5A and 5B that are the same or similar to those that have been previously described will be omitted for brevity.

Referring to FIGS. 5A and 5B, the plurality of bond wires 280B may include stacked bonds on both ends of the bond wire. For example, a second bond wire 280_2 of the plurality of bond wires 280B may have a first end 281 that is stacked on a first end 281 of a first bond wire 280_1 of the plurality of bond wires 280B. In addition a second end 282 of the second bond wire 280_2 may also be stacked on a second end 282 of the first bond wire 280_1. Thus, both opposing ends 281, 282 of the bond wire may have a stacked bond with another bond wire of the plurality of bond wires 280B.

Figure 5C:
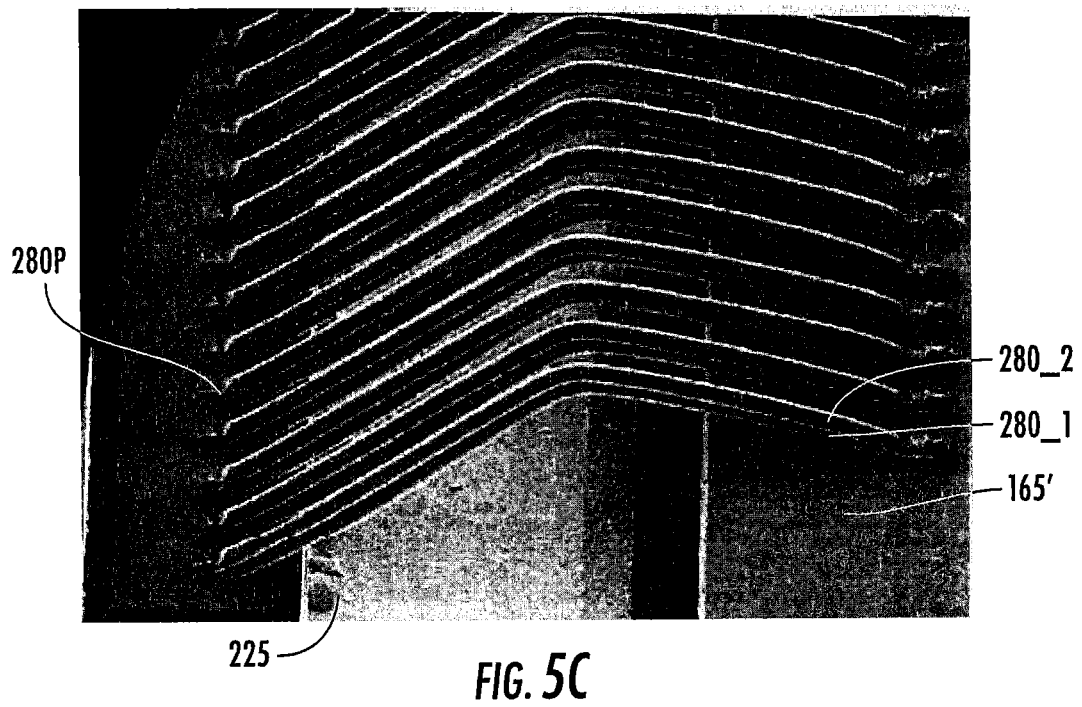
FIG. 5C is a photo illustrating a stacked bond configuration according to embodiments of the present disclosure in which both sides of a bond wire are bonded in a stacked configuration.

By stacking both ends of the bond wires, stacked connection points 280P may be formed on both the output lead pad 165' and the output pad 225. As a result, the width of both pads may be reduced. For example, the output pad 225 may have a second width W2 that is smaller (e.g., narrower) than the output pad of a conventional device. Similarly, the output lead pad 165' may have a third width W3 that is smaller (e.g., narrower) than the output lead pad of a conventional device. FIG. 5C is a photo of an embodiment according to the present disclosure in which the first bond wire 280_1 is bonded in a stacked configuration on both sides with the second bond wire 280_2. In FIG. 5C, the two bond wires are wedge-bonded, but the embodiments of the present disclosure are not limited thereto.

Though FIGS. 5A to 5C illustrate embodiments in which bond wires are stacked in pairs, the present disclosure is not limited to such a configuration. In some embodiments, the number of stacked bond wires may be larger than two.

Figure 5D:
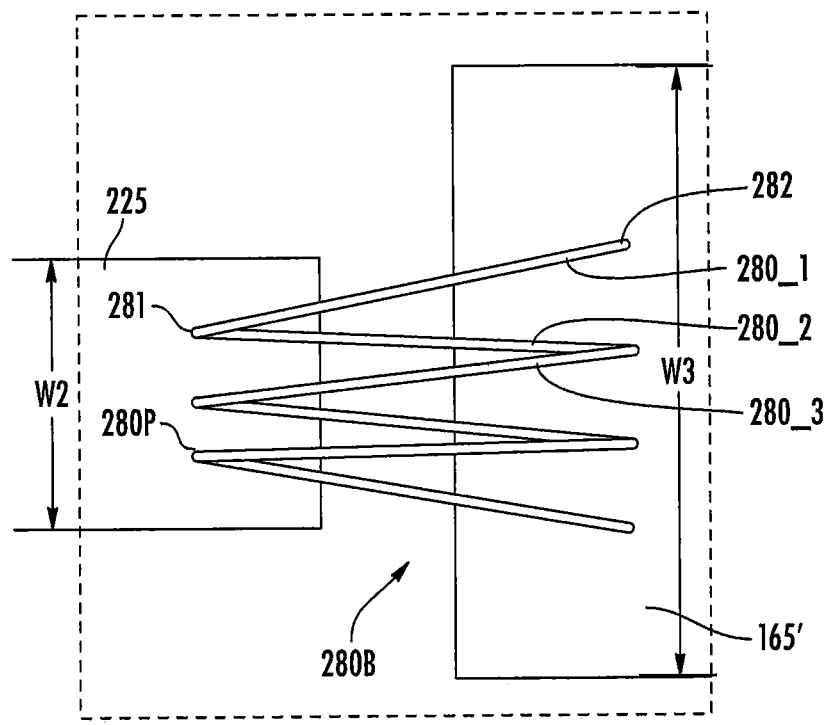
FIG. 5D is a schematic plan view illustrating an additional embodiment of the present disclosure.

In some embodiments, a given bond wire may have one end sharing a stacked bond with a first bond wire and a second end sharing a stacked bond with a second bond wire. FIG. 5D is a schematic plan view illustrating such an additional embodiment of the present disclosure.

Referring to FIG. 5D, a first bond wire 280_1 of the plurality of bond wires 280B may share a stacked bond with a second bond wire 280_2 of the plurality of bond wires 280B. For example, a first end 281 of the second bond wire 280_2 be stacked on and bonded to a first end 281 of the first bond wire 280_1. The second bond wire 280_2 may share a stacked bond with a third bond wire 280_3 of the plurality of bond wires 280B. For example, a second end 282 of the third bond wire 280_3 be stacked on and bonded to a second end 282 of the second bond wire 280_2. Thus, in some embodiments, opposite end of a given bond wire may be stacked on ends of different bond wires of the plurality of bond wires 280B.

A configuration such as that illustrated in FIG. 5D may allow for the mounting areas to which both ends of the bond wire are bonded to be reduced. For example, the first ends 281 of the plurality of bond wires 280B may be bonded to the output pad 225 and second ends 282 of the plurality of bond wires 280B may be bonded to the output lead pad 165'. In some embodiments, the output pad 225 may have a second width W2 that is smaller (e.g., narrower) than the output pad of a conventional device. Similarly, the output lead pad 165' may have a third width W3 that is smaller (e.g., narrower) than the output lead pad of a conventional device.

FIGS. 6A to 6D are cross-sectional views illustrating additional embodiments of the present disclosure. FIGS. 6A to 6D illustrate variations to the embodiments previously described. Thus, each of the prior-discussed embodiments may be modified as discussed and illustrated with respect to FIGS. 6A to 6D.

In some embodiments, it may be beneficial to stabilize the stacked bonds. For example, in some embodiments, the height of the stacked bond may lead to one of the stacked bond wires being slightly offset from another of the bond wires. In order to improve stability and provide additional contact area, a wire width of a lower bond wire may be larger than a wire width of a bond wire that is on (e.g., above, in a vertical direction) the lower bond wire.

Figure 6A:
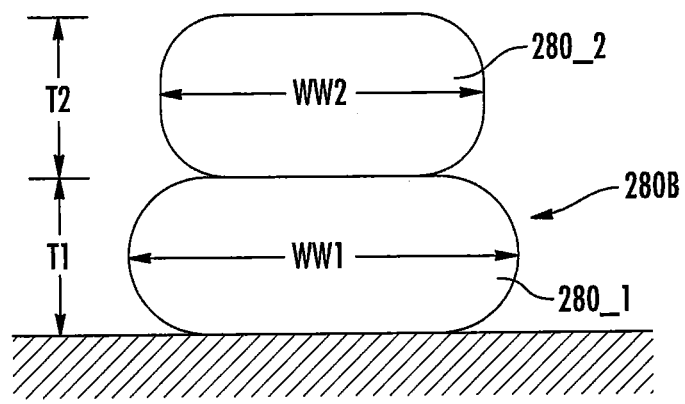
FIGS. 6A to 6D are cross-sectional views illustrating additional embodiments of the present disclosure.

For example, referring to FIG. 6A, a first bond wire 280_1 of the plurality of bond wires 280B may share a stacked bond with a second bond wire 280_2 of the plurality of bond wires 280B. A bottom surface of the second bond wire 280_2 may be bonded to a top surface of the first bond wire 280_1. As described previously, a first thickness T1 (e.g., in a vertical direction) of the first bond wire 280I may be smaller than a second thickness T2 of the second bond wire 280_2.

In addition, a first wire width WW1 (e.g., in a horizontal direction that is perpendicular to the vertical direction) of the first bond wire 280_1 may be greater than a second wire width WW2 of the second bond wire 280_2. The wire width (e.g., first wire width WW1) may be a largest dimension of the cross-section of the bonding portion of bond wire in a horizontal direction. By placing the second bond wire 280_2 having the smaller second wire width WW2 on the first bond wire 280_1, an increased alignment margin may be available for the stacked bond between the first bond wire 280_1 and the second bond wire 280_2. In addition, having the smaller bond wire on the larger bond wire may improve a stability of the stacked bond wires.

The larger first wire width WW1 may be achieved in multiple ways. For example, the first bond wire 280_1 may be approximately circular prior to bonding. By application of pressure during the bonding process, the first bond wire 280_1 may be compressed such that the first wire width WW1 in the horizontal direction increases while a first thickness T1 in the vertical direction decreases. Thus, while the first bond wire 280_1 may be approximately circular with a given radius prior to bonding, the bonding operation may increase the wire width in the horizontal direction to a value that exceeds the radius of the non-bonding portion of the first bond wire 280_1.

When the second bond wire 280_2 is bonded to the first bond wire 280_1, the pressure applied during the bonding process may compress the second bond wire 280_2 in a similar manner as with the first bond wire 280_1. In addition, the first bond wire 280_1 may be further compressed, as the application of pressure during the bonding of the second bond wire 280_2 may also impact the first bond wire 280_1. Thus, the bonding of the second bond wire 280_2 to the first bond wire 280_1 may further increase the first wire width WW1 of the first bond wire 280_1 to be larger than the second bond wire 280_2.

In addition to the increase in wire width due to the bonding process, the wire width of the bond wires may also be accomplished using bond wires of different diameters. For example, in some embodiments a first diameter of the first bond wire 280_1 that is bonded to the pad may be larger than a second diameter of the second bond wire 280_2 that is bonded to the top surface of the first bond wire 280_1. The use of bond wires with different diameters may also provide different wire widths for the various bond wires in the stacked bond.

Figure 6B:
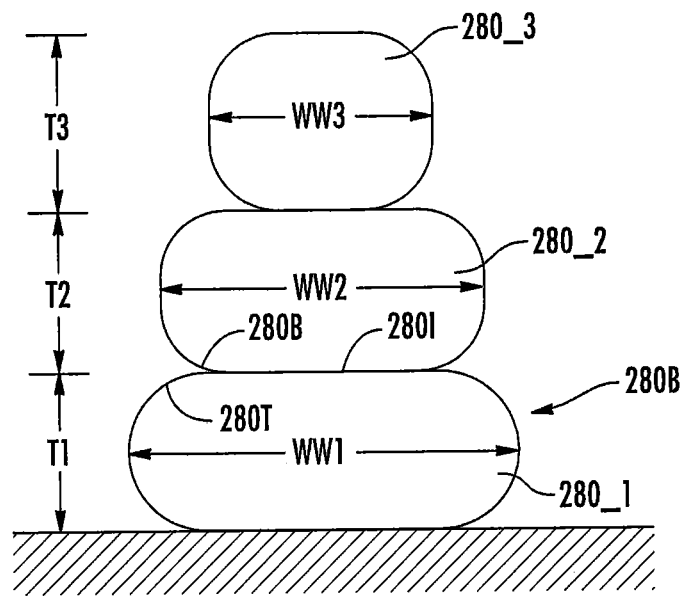

Utilizing different wire widths in the bond stack may also be useful in bond stacks having more than two bond wires. For example, FIG. 6B illustrates an embodiment of a stacked bond utilizing three bond wires. As shown in FIG. 6B, a first bond wire 280_1 may be bonded to a contact surface of a pad. A second bond wire 280_2 may be bonded to a top surface of the first bond wire 280_1. A third bond wire 280_3 may be bonded to a top surface of the second bond wire 280_2. A first wire width WW1 of the first bond wire 280_1 may be greater than a second wire width WW2 of the second bond wire 280_2. The second wire width WW2 of the second bond wire 280_2 may be greater than a third wire width WW3 of the third bond wire 280_3. In some embodiments, a thickness T1 of the bonding portion of the first bond wire 280_1 may be smaller than a second thickness T2 of the bonding portion of the second bond wire 280_2, and the second thickness T2 of the bonding portion of the second bond wire 280_2 may be smaller than a third thickness T3 of the bonding portion of the third bond wire 280_3, however, the present disclosure is not limited thereto. In embodiments in which the first bond wire 280_1 has a larger diameter than the second bond wire 280_2 and/or the third bond wire 280_3, the thickness T1 of the bonding portion of the first bond wire 280_1 may equal or exceed the thicknesses T2, T3 of the second and third bond wires 280_2, 280_3.

Figure 6C:
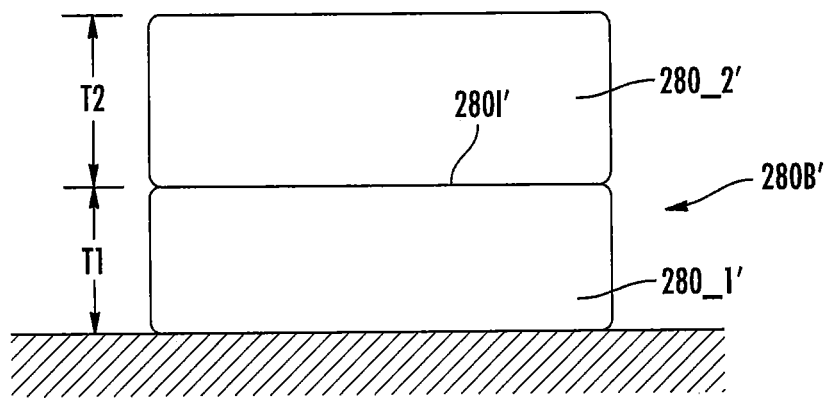

Many of the embodiments described herein discussed the utilization of bond wires, but it will be understood that any of the embodiments described herein regarding stacked bond wires apply equally to stacked wire ribbons. FIG. 6C illustrates an example of a stacked wire ribbon, according to some embodiments of the present disclosure.

Embodiments utilizing a wire ribbon may be utilized in place of any of the embodiments described herein that utilize bond wires. For example, referring to FIG. 6C, the plurality of bond wires 280B' may include wire ribbons. A first wire ribbon 280_1' may be bonded to a contact surface of a pad. The first wire ribbon 280_1' of the plurality of bond wires 280B' may share a stacked bond with a second wire ribbon 280_2' of the plurality of bond wires 280B. A bottom surface of the second wire ribbon 280_2' may be bonded to a top surface of the first wire ribbon 280_1'. A first thickness T1 (e.g., in a vertical direction) of the first wire ribbon 280_1' may be smaller than a second thickness T2 of the second wire ribbon 280_2'.

As with round bond wires, an interface 280I' between the first wire ribbon 280_1' and the second wire ribbon 280_2' may provide a physical and/or electrical connection between the second wire ribbon 280_2' and a contact surface to which the first wire ribbon 280_1' is bonded. In some embodiments, the top surface of the first wire ribbon 280_1' may be substantially horizontal and the bottom surface of the second wire ribbon 280_2' may be substantially horizontal. In some embodiments, the interface 280I' between the first wire ribbon 280_1' and the second wire ribbon 280_2' may extend over twenty-five percent of the perimeter of the first wire ribbon 280_1' and/or the perimeter of the second wire ribbon 280_2'. In some embodiments, the interface 280I' between the first wire ribbon 280_1' and the second wire ribbon 280_2' may extend over fifty percent of the top surface of the first wire ribbon 280_1' and/or the bottom surface of the second wire ribbon 280_2'. In some embodiments, the interface 280I' between the first wire ribbon 280_1' and the second wire ribbon 280_2' may extend over seventy-five percent of the top surface of the first wire ribbon 280_1' and/or the bottom surface of the second wire ribbon 280_2'. These contact percentages are merely examples, and the embodiments of the present disclosure are not solely limited to these examples.

Figure 6D:
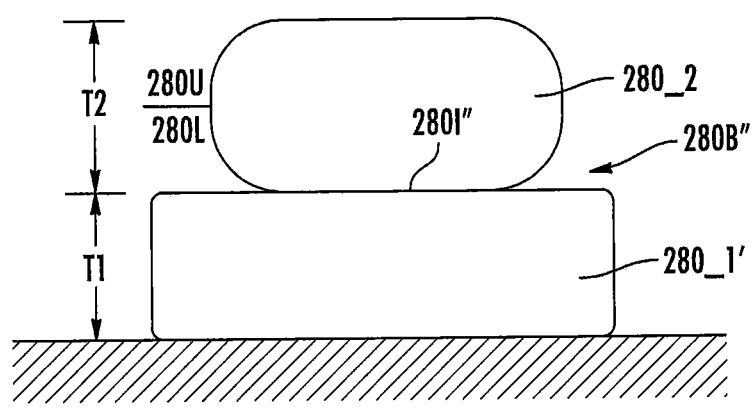

In some embodiments, the use of round bond wires and wire ribbons may be mixed. FIG. 6D illustrates an example in which a plurality of bond wires 280B" includes stacked bonds including a first wire ribbon 280_1' and a second bond wire 280_2. The first wire ribbon 280_1' may be bonded to a contact surface (e.g., a pad) and may share a stacked bond with the second bond wire 280_2. A bottom surface of the second bond wire 280_2 may be bonded to a top surface of the first wire ribbon 280_1'. A first thickness T1 (e.g., in a vertical direction) of the first wire ribbon 280_1' may be smaller than a second thickness T2 of the second bond wire 280_2, but the embodiments of the present disclosure are not limited thereto.

In some embodiments, an interface 280I" between the first wire ribbon 280_1' and the second bond wire 280_2 may provide a physical and/or electrical connection between the second bond wire 280_2 and the contact surface to which the first wire ribbon 280_1' is bonded. In some embodiments, the interface 280I" between the first wire ribbon 280_1' and the second bond wire 280_2 may extend over twenty-five percent of the perimeter of the first wire ribbon 280_1' and/or over twenty-five percent of the circumference of the second bond wire 280_2. In some embodiments, the interface 280I" between the first wire ribbon 280_1' and the second bond wire 280_2 may extend over fifty percent of the top surface of the first wire ribbon 280_1' and/or the lower circumference 280L of the second bond wire 280_2. Stated another way, the circumference of the second bond wire 280_2 may be divided into an upper half 280U and a lower half 280L according to a horizontal line through the second bond wire 280_2. In some embodiments over fifty percent of the top surface of the first wire ribbon 280_1' and over fifty percent of the lower half 280L of the circumference of the second bond wire 280_2 may be in contact with one another. In some embodiments, over seventy-five percent of the top surface of the first wire ribbon 280_1' and over seventy-five percent of the lower half 280L of the circumference of the second bond wire 280_2 may be in contact with one another. These contact percentages are merely examples, and the embodiments of the present disclosure are not solely limited to these examples.

Figure 7A:
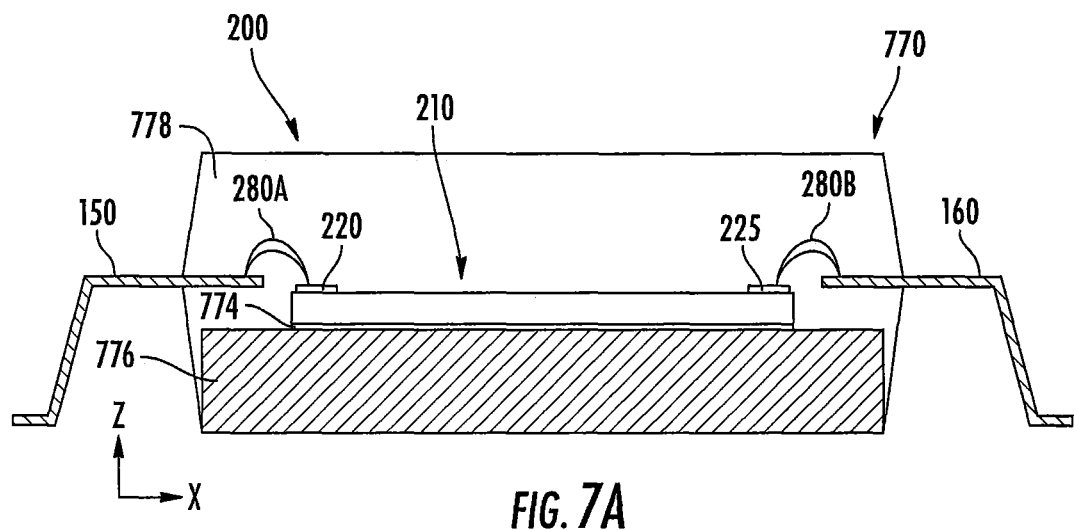
FIGS. 7A and 7B illustrate packaged devices of some embodiments of the present disclosure.
Figure 7B:
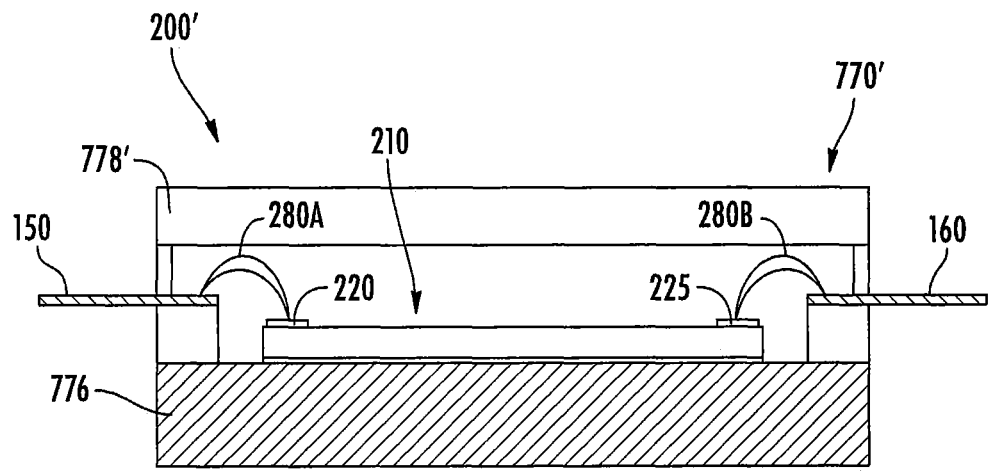

In some embodiments, the stacked bonds described herein may be utilized to provide packaged devices. FIGS. 7A and 7B schematically illustrate packaged devices of some embodiments of the present disclosure. It will be appreciated that FIGS. 7A and 7B are highly simplified diagrams intended to represent structures for identification and description and are not intended to represent the structures to physical scale. As shown in FIG. 7A, the MMIC package 200 includes MMIC device 210 that is mounted within a package 770, also referred to herein as a packaged MMIC device. In some embodiments, the MMIC package 200 may be configured to operate with input signals in the RF range, but the embodiments of the present disclosure are not limited thereto. The package 770 includes a submount (also referred to herein as a base or flange) 776 including one or more electrically conductive package leads thereon, for example, one or more input (e.g., gate) leads 150 and one or more output (e.g., drain) leads 160. The MMIC device 210 is mounted on the upper surface of the submount 776, such as by a thermally and/or electrically conductive die attach layer 774.

The submount 776 may be or may include an electrically conductive attachment surface, for example, a metal substrate (or "slug") that acts as a thermally conductive heat sink. In some embodiments, the submount 776 may additionally or alternatively include a redistribution layer (RDL) laminate structure including conductive layers fabricated using semiconductor processing techniques, a printed circuit board with metal traces, and/or a ceramic substrate that includes electrically conductive vias and/or pads. In some embodiments, a metal lead frame may be formed and then processed to provide the metal submount 776 and/or the package leads (e.g., gate and drain leads) 150 and 160. The MIC package 200 also includes housing 778 (e.g., a plastic overmold) that at least partially surrounds the MMIC device 210, the package leads 150, 160 and the metal submount 776.

The MMIC device 210 may be coupled to the input lead 150 and the output lead 160. For example, the input lead 150 may be connected to the input pad 220 by a first plurality of bond wires 280A, the output lead 160 may be connected to the output pad 225 by a second plurality of bond wires 280B. The first plurality of bond wires 280A and/or the second plurality of bond wires 280B may be implemented using stacked bonds according to any embodiment, or a combination of the embodiments, described herein.

While FIG. 7A illustrates a package 770 incorporating a plastic overmold 778, the embodiments of the present disclosure are not limited to such a package configuration. FIG. 7B is a schematic side view of another example of a MMIC package 200' that is similar to the MMIC package 200 discussed above with reference to FIG. 7A. MMIC package 200' differs from MMIC package 200 of FIG. 7A in that it includes a different package 770'. The package 770' includes the metal submount 776 (which acts as a metal heat sink and can be implemented as a metal slug), as well as input and output leads 150, 160. In some embodiments, a metal lead frame may be formed that is then processed to provide the metal submount 776 and/or the input and output leads 150, 160. MMIC package 200' also includes a housing 778' that at least partially surrounds the MMIC device 210, the leads 150, 160 and the metal submount 776. The housing 778' may comprise a ceramic housing in some embodiments, and the input lead 150 and the output lead 160 may extend through the housing 778'. In some embodiments, the housing 778' may comprise plastic and/or a printed circuit board. The housing 778' may comprise multiple pieces, such as a frame that forms the lower portion of the sidewalls and supports the input and output leads 150, 160, and a lid that is placed on top of the frame. The interior of the device may comprise an air-filled cavity. The sidewalls and lid of the housing 778' of FIG. 7B replace the plastic overmold 778 included in MMIC package 200 illustrated in FIG. 7A.

While the embodiments discussed previously have focused on stacked wire bonds as applied to MMIC devices, it will be understood that the stacked bonding techniques described herein are not limited to MMIC devices and can be readily applied to other devices. FIGS. 8A to 8E are schematic plan views of packaged FET-based power amplifiers according to some embodiments of the present disclosure.

Figure 8A:
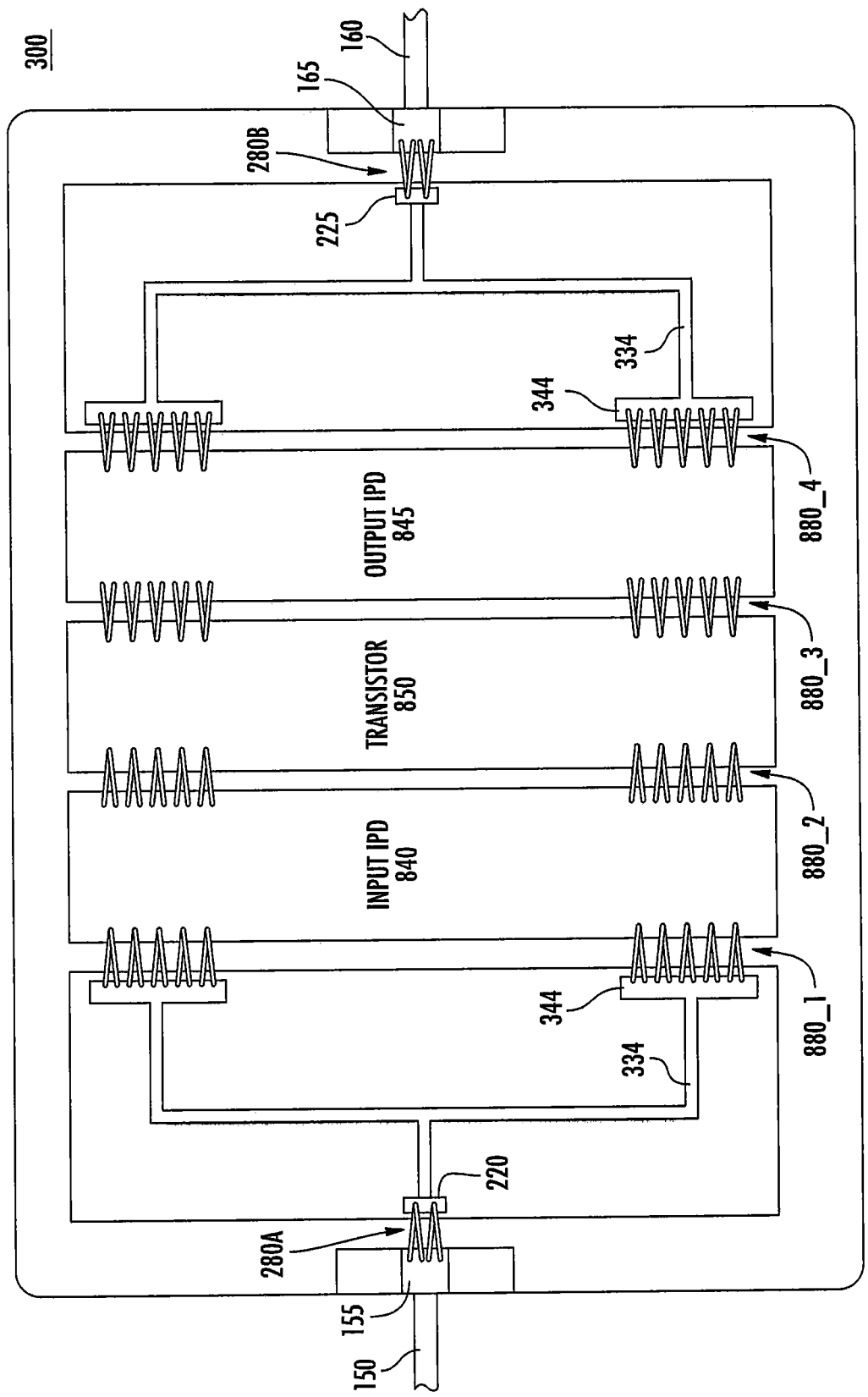

For example, FIG. 8A is a schematic plan view (i.e., a view looking down at the device from above) of a packaged internally-matched FET power amplifier 300 according to some embodiments of the present disclosure. The FET power amplifier 300 may include one or more integrated circuit chips and may also include other electronic circuit substrates such as, for example, printed circuit boards or ceramic circuit substrates. The FET power amplifier 300 includes an input lead 150 that is electrically connected to an input lead pad 155 and an output lead 160 that is electrically connected to an output lead pad 165.

As shown in FIG. 8A, the FET power amplifier 300 also includes integrated passive device (IPD) circuits (e.g., including input IPD circuit 840 and output IPD circuit 845) and transistor circuit 850. An input pad 220 may be coupled to the input IPD circuit 840. The input IPD circuit 840 may be coupled between the input pad 220 and the transistor circuit 850. The input IPD circuit 840 may include a capacitor and/or other circuit elements configured to provide impedance matching. The input IPD circuit 840 may also include elements configured to perform harmonic termination. A first plurality of bond wires 280A are provided that interconnect the input lead pad 155 to the input pad 220.

Similarly, an output pad 225 may be coupled to the output IPD circuit 845. The output IPD circuit 845 may be coupled between the output pad 225 and the transistor circuit 850. The output IPD circuit 845 may include a capacitor and/or other circuit elements configured to provide impedance matching. The output IPD circuit 845 may also include elements configured to perform harmonic termination. A second plurality of bond wires 280B are provided that interconnect the output lead pad 165 to the output pad 225.

The FET power amplifier 300 may include RF transmission lines 334 and various bonding pads such as bond pads 344. The RF transmission lines 334 may form a feed network that connects the input/output pads 220/225 to the gate fingers of unit cell transistors that are included in the transistor circuit 850.

The unit cell transistors that amplify the input signal are implemented on the transistor circuit 850. Examples of suitable integrated circuits are disclosed, for example, in U.S. Patent Publication No. 2017/0271497, the entire content of which is incorporated herein by reference as if set forth fully herein.

The impedance of the transistor circuit 850 may not always be well-matched to the impedance seen at the input lead 150 or the output lead 160 (which may each be, for example, 50 ohms). Accordingly, the internally-matched FET power amplifier 300 further includes the input and output IPD circuits 840, 845 that improve the impedance match and/or harmonic termination between the transistor circuit 850 and the input lead 150 and the output lead 160 over the operating frequency band of the internally-matched FET power amplifier 300. Each IPD circuit 840, 845 may include transmission lines and reactive components such as capacitors and/or inductive elements.

The IPD circuits 840, 845 may each comprise, for example, a substrate such as a ceramic substrate (e.g., an alumina substrate) or a printed circuit board that has capacitors, inductors and/or resistors formed thereon. In some cases, bond wires 880 that extend between the feed network 334 and the IPD circuits 840, 845 and/or between the IPD circuits 840, 845 and the transistor circuit 850 may act as inductors, and capacitors may be formed as part of the IPD circuits 840, 845 so that, for example, an inductor-capacitor-inductor (LCL) reactive circuit is formed at the input and output of the transistor circuit 850.

In some embodiments, the first plurality of bond wires 280A between the input lead pad 155 and the input pad 220 and/or the second plurality of bond wires 280B between the output lead pad 165 and the output pad 225 may be implemented in a stacked bond configuration using any of the embodiments for stacked bonds described herein. For example, the first plurality of bond wires 280A and the second plurality of bond wires 280B are illustrated as incorporating a stacked bond on one side of respective pairs of the bond wires. However, the embodiments described herein are not limited to this configuration. Each of the stacked bond embodiments described herein, or a combination of the stacked bond embodiments described herein, may be used to provide either bond connection.

Moreover, the bond wires between the feed network 334 and the input IPD circuit 840 and/or between the output IPD circuit 845 may utilize stacked bonds according to some embodiments described herein. For example, the feed network 334 may include feed pads 344. In some embodiments, first bond wires 880_1 may be provided between the feed pads 344 and the input IPD circuit 840. In some embodiments, second bond wires 880_2 may be provided between the input IPD circuit 840 and the transistor circuit 850. In some embodiments, third bond wires 880_3 may be provided between transistor circuit 850 and the output IPD circuit 845. In some embodiments, fourth bond wires 880_4 may be provided between the output IPD circuit 845 and additional feed pads 344.

One or more of the bond wires 880_1, 880_2, 880_3, and/or 880_4 may be provided incorporating stacked bonds according to one or more embodiments described herein. In FIG. 8A, each of the bond wires 880_1, 880_2, 880_3, and/or 880_4 are illustrated using pairs of bond wires having a shared stacked bond. However, other embodiments of stacked bonds described herein may be utilized without deviating from the disclosure. Moreover, the use of stacked bonds for each of the bond wires 880_1, 880_2, 880_3, and/or 880_4 is merely an example of a potential configuration. In some embodiments, one or more of the bond wires 880_1, 880_2, 880_3, and/or 880_4 may utilize a conventional, non-stacked bond wire implementation. That is to say that the bond wires 880_1, 880_2, 880_3, and/or 880_4 may incorporate a mixed configuration in which some of the bond wires incorporate stacked bonds and others of the bond wires do not.

Similarly, the first plurality of bond wires 280A, the second plurality of bond wires 280B, and the bond wires 880_1, 880_2, 880_3, and/or 880_4 are illustrated as having a stacked bond on a particular side of the bond connection (e.g., the side closest to the transistor circuit 850). However, this is merely an example, and the stacked bonding configuration could be reversed to have the stacked bond on the opposite side of the connection (e.g., the side farthest from the transistor circuit 850).

Figure 8B:
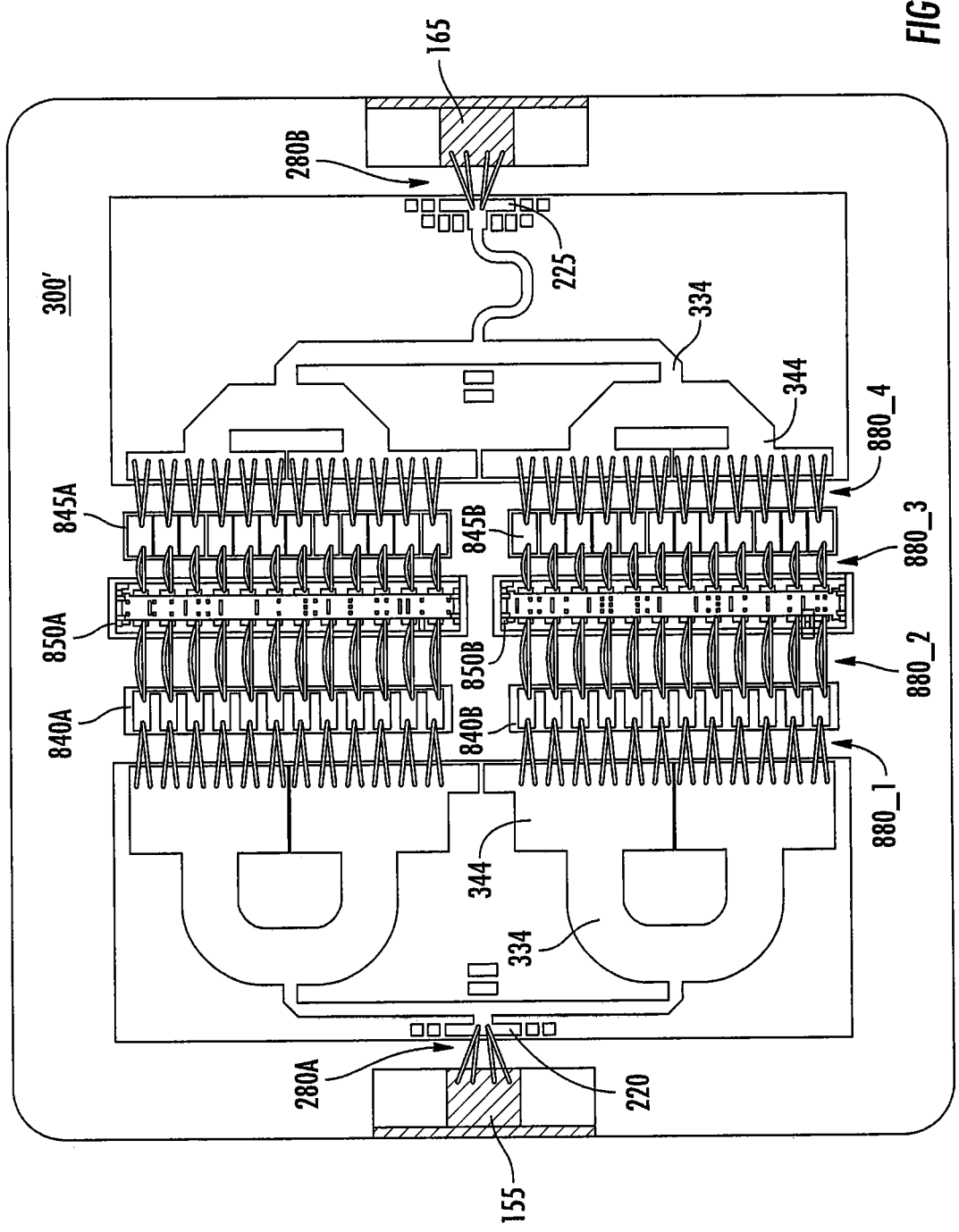

FIG. 8B is an additional example of a FET power amplifier 300' that illustrates a different configuration of the transistor, IPD circuits, and feed networks, according to some embodiments of the present disclosure. Referring to FIG. 8B, the FET power amplifier 300' includes an input lead pad 155 coupled to input pad 220 and an output lead pad 165 coupled to output pad 225. The FET power amplifier 300' includes two transistor circuits 850A and 850B. Each of the transistor circuits 850A, 850B is respectively coupled to input IPD circuits 840A, 840B and output IPD circuits 845A,845B. The input IPD circuits 840A, 840B may be respectively coupled between the input pad 220 and the transistor circuits 850A, 850B by a feed network incorporating RF transmission lines 334 and bond pads 344. The output IPD circuits 845A, 845B may be respectively coupled between the transistor circuits 850A, 850B and the output pad 225 by portions of the feed network.

A first plurality of bond wires 280A are provided that interconnect the input lead pad 155 to the input pad 220. A second plurality of bond wires 280B are provided that interconnect the output lead pad 165 to the output pad 225. In some embodiments, the first plurality of bond wires 280A between the input lead pad 155 and the input pad 220 and/or the second plurality of bond wires 280B between the output lead pad 165 and the output pad 225 may be implemented in a stacked bond configuration using any of the embodiments for stacked bonds described herein. For example, the first plurality of bond wires 280A and the second plurality of bond wires 280B are illustrated as incorporating a stacked bond on one side of respective pairs of the bond wires. However, the embodiments described herein are not limited to this configuration. Each of the stacked bond embodiments described herein, or a combination of the stacked bond embodiments described herein, may be used to provide either bond connection.

In addition, stacked bonds may also be utilized between the various circuit elements of the FET power amplifier 300'. For example, first bond wires 880_1 may be provided between the feed pads 344 and respective ones of the input IPD circuits 840A, 840B. In some embodiments, second bond wires 880_2 may be respectively provided between the input IPD circuits 840A, 840B and the transistor circuits 850A, 850B. In some embodiments, third bond wires 880_3 may be respectively provided between transistor circuits 850A, 850B and the output IPD circuits 845A, 845B. In some embodiments, fourth bond wires 880_4 may be provided between respective ones of the output IPD circuits 845A, 845B and additional feed pads 344.

One or more of the bond wires 880_1, 880_2, 880_3, and/or 880_4 may be provided incorporating stacked bonds according to one or more embodiments described herein. For example, referring to FIG. 8B, the first plurality of bond wires 280A, the second plurality of bond wires 280B, first bond wires 880_1, and fourth bond wires 880_4 may include stacked bonds on one side of the connection, with the ends of the bond wires being separated on the opposite side of the connection (e.g., a V-shaped connection, similar to those illustrated in FIG. 2B). It will be understood that the shared bond may be located on either side of the bond connection and that a different number of bond wires may be used. In addition, second bond wires 880_2 and third bond wires 880_3 may include stacked bonds on both sides of the bond connection (e.g., similar to those illustrated in FIG. 5A). These configurations are merely examples, and other configurations of the bond wires, including the use of non-stacked bond wires, could be used alternatively or in addition to the illustrated combinations. FIG. 8B illustrates that different types of stacked bonds can be used in a single package, such as FET amplifier 300'. The number of bond wires and the placement of the bonds are included to assist in the description and are not intended to limit the present disclosure. More or fewer bonds and/or bond wires may be used depending on the requirements of the package. It will be understood that other embodiments of stacked bonds described herein, including different numbers of bond wires and/or different placement of the shared bonds, may be utilized without deviating from the disclosure.

FIG. 8C is a plan view of an additional example of a FET amplifier 300", according to some embodiments of the present disclosure. The FET amplifier 300" includes input lead 150 and output lead 160. The FET amplifier 300" also includes input IPD circuit 840 and transistor circuit 850.

The FET amplifier 300″ includes a mixture of stacked and non-stacked bonds. For example, a first plurality of bond wires 280A may extend from the input lead 150 to the input IPD circuit 840. The first plurality of bond wires 280A may incorporate stacked bonds. For example, the first plurality of bond wires 280A may have stacked bonds on one side of the connection, with the ends of the bond wires being separated on the opposite side of the connection (e.g., a V-shaped connection, similar to those illustrated in FIG. 2B). It will be understood that the shared bond may be located on either side of the bond connection and that a different number of bond wires may be used.

A second plurality of bond wires 280B may extend between the transistor circuit 850 and the output lead 150. The second plurality of bond wires 280B may incorporate stacked bonds. For example, the second plurality of bond wires 280B may have stacked bonds on both sides of the bond connection (e.g., similar to those illustrated in FIG. 5A).

Bond wires 881 may extend between the input IPD circuit 840 and the transistor circuit 850. Referring to FIG. 8C, the bond wires 881 may not incorporate stacked bonds, but the present disclosure is not limited thereto. FIG. 8C illustrates that different types of stacked bonds can be used in a single package, and may be mixed with non-stacked bond connections. The number of bond wires and the placement of the bonds are included to assist in the description and are not intended to limit the present disclosure. More or fewer bonds may be used depending on the requirements of the package. It will be understood that other embodiments of stacked bonds, including different numbers of bond wires and/or different placement of the shared bonds, described herein may be utilized without deviating from the disclosure.

Figure 8D:
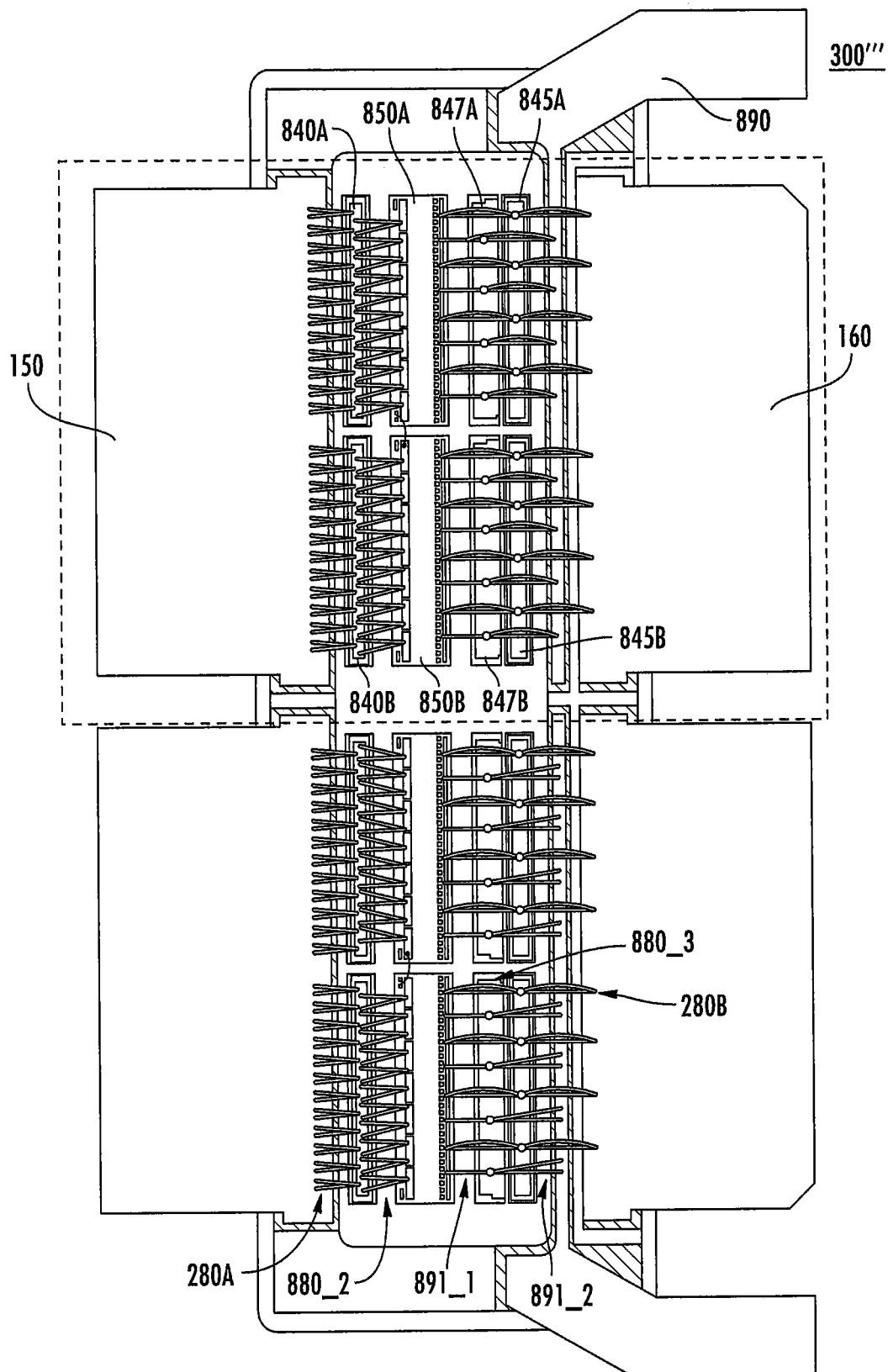

FIG. 8D is a plan view of an additional example of a FET power amplifier 300′″ that illustrates a more complex arrangement of wire bonds and circuits. The FET power amplifier 300′″ includes two amplifier paths, each coupled to an input lead 150 and an output lead 160. For brevity, this description will focus on one of the transistor paths enclosed in a dashed box in FIG. 8D.

Referring to FIG. 8D, the FET power amplifier 300′″ includes an input lead 150, an output lead 160, and two transistor circuits 850A and 850B. Each of the transistor circuits 850A, 850B is respectively coupled to input IPD circuits 840A, 840B. The input IPD circuits 840A, 840B may be coupled to the input lead 150 by a first plurality of bond wires 280A and to the transistor circuits 850A, 850B by second bond wires 880_2. The first plurality of bond wires 280A and the second bond wires 880_2 may incorporate stacked bonds. For example, the first plurality of bond wires 280A and the second bond wires 880_2 may have stacked bonds on one side of the connection, with the ends of the bond wires being separated on the opposite side of the connection (e.g., a V-shaped connection, similar to those illustrated in FIG. 2B). It will be understood that the shared bond may be located on either side of the bond connection and that a different number of bond wires may be used.

Each of the transistor circuits 850A, 850B may also be respectively coupled to output IPD circuits 845A, 845B. The output IPD circuits 845A, 845B may be coupled to the output lead 160 by a second plurality of bond wires 280B and to the transistor circuits 850A, 850B by third bond wires 880_3. The second plurality of bond wires 280B and the third bond wires 880_3 may incorporate stacked bonds. For example, the second plurality of bond wires 280B and the third bond wires 880_3 may have stacked bonds on both sides of the bond connection (e.g., similar to those illustrated in FIG. 5A).

The FET power amplifier 300′″ also incorporates supply circuits 847A, 847B. The supply circuits 847A, 847B may include circuit elements configured to provide supply biasing and/or tuning to the transistor circuits 850A, 850B. The supply circuits 847A, 847B may be connected to the transistor circuits 850A, 850B by bond wires 891_1. In some embodiments, the bond wires 891_1 may be single bond wires (e.g., non-stacked) but the present disclosure is not limited thereto. The FET power amplifier 300′″ may include a DC feed pad 890 configured to provide a high current DC signal to the supply circuits 847A, 847B. The supply circuits 847A, 847B may be connected to the DC feed pad 890 by bond wires 891_2. In some embodiments, the bond wires 891_2 may incorporate stacked bonds. For example, in some embodiments, the bond wires 891_2 may have stacked bonds on both sides of the bond connection (e.g., similar to those illustrated in FIG. 5A). This is illustrated in the set of bond wires 891_2 in the top half of FIG. 8D. In some embodiments, the bond wires 891_2 may have stacked bonds on one side of the connection, with the ends of the bond wires being separated on the opposite side of the connection (e.g., a V-shaped connection, similar to those illustrated in FIG. 2B). This is illustrated in the set of bond wires 891_2 in the bottom half of FIG. 8D. Thus, the type of stacked bonds used in a particular package need not be limited to one type and, in some embodiments, the type of stacked bonds may be mixed within a given package. In some embodiments, both the top and bottom sets of bond wires 891_2 could be a same type of stacked bond configuration.

In FIG. 8D, the number of bond wires and the placement of the bonds are included to assist in the description and are not intended to limit the present disclosure. More or fewer bonds may be used depending on the requirements of the package. It will be understood that other embodiments of stacked bonds described herein may be utilized without deviating from the disclosure. For example, bond wires shown as stacked in FIG. 8D may, in some embodiments, be arranged in any configuration of stacked bond described herein, or may not incorporate stacked bonds. Similarly, embodiments illustrated non-stacked bonds could also be embodied in any configuration of stacked bond described herein.

FIG. 5E is an additional example of a FET power amplifier 300″″ that illustrates a different configuration of the transistor, IPD circuits, and feed networks, according to some embodiments of the present disclosure. FIG. 5E illustrates that stacked bond wires can be used in non-symmetric configurations of transistor packages. For example, FIG. 8E illustrates a main configuration and a peak configuration of transistor paths similar to what may be used in a Doherty amplifier.

Referring to FIG. 5E, the FET power amplifier 300″″ includes a first input lead 150_1, a second input lead 150_2, a first output lead 160_1, and a second output lead 160_2. A first input IPD circuit 840A, a first transistor circuit 850A, and a first output IPD circuit 845A are coupled between the first input lead 150_1 and first output lead 160_1. A second input IPD circuit 840B, a second transistor circuit 850B, and second output IPD circuits 845B_1, 845B_2 are coupled between the second input lead 150_2 and second output lead 160_2.

Figure 8E:
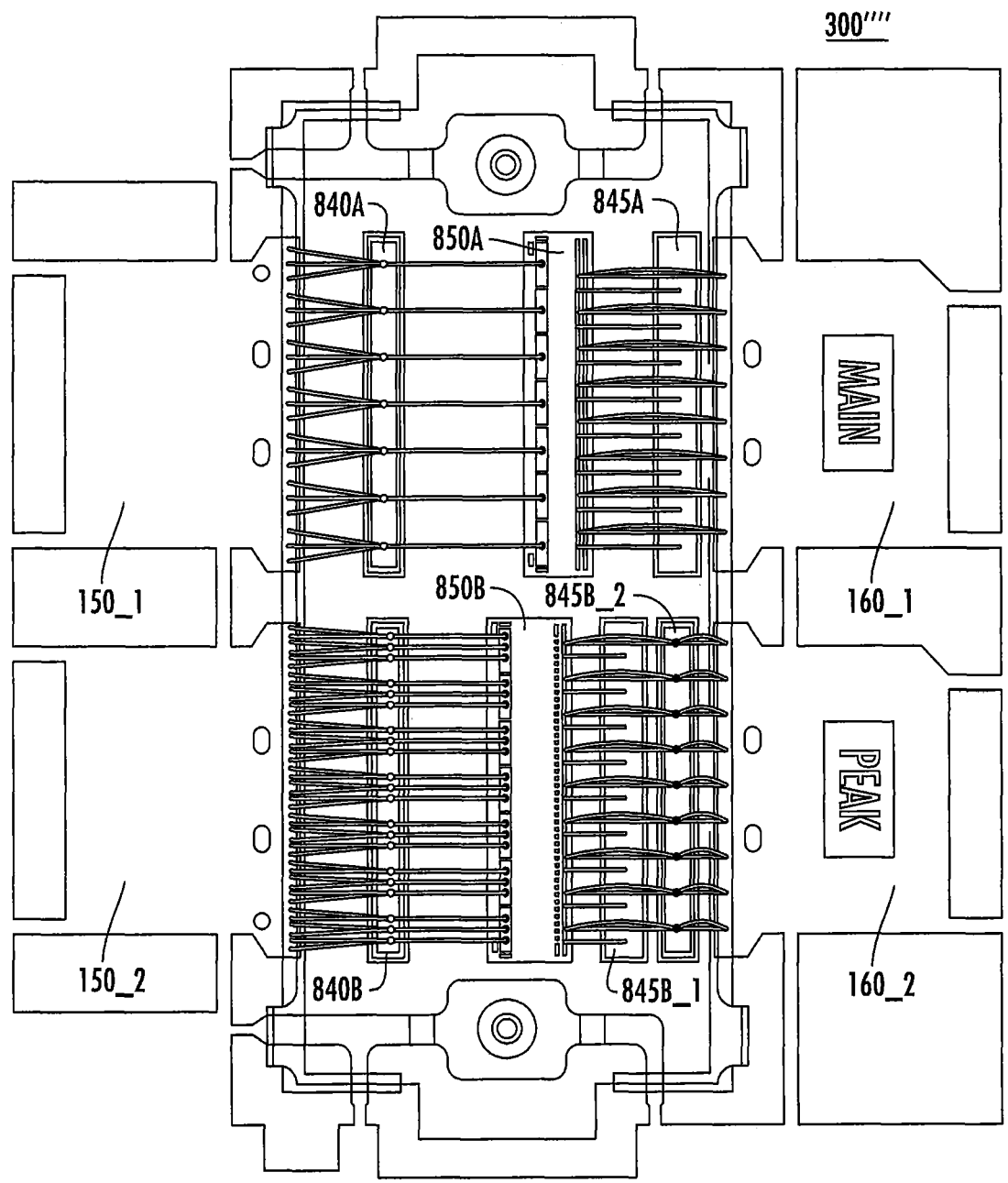

As illustrated in FIG. 8E, various configurations of stacked bonds may be utilized in the FBT power amplifier

300''''. For example, stacked bonds may be used between the first input lead 150_1 and the first input IPD circuit 840A and between the second input lead 150_2 and the second input IPD circuit 840B. In FIG. 8E, the stacked bonds between the first input lead 150_1 and the first input IPD circuit 840A and between the second input lead 150_2 and the second input IPD circuit 840B are all illustrated as having stacked bonds on one side of the connection, with the ends of the bond wires being separated on the opposite side of the connection (e.g., a V-shaped connection, similar to those illustrated in FIG. 2B), but the present disclosure is not limited thereto. FIG. B illustrates that the number of stacked bonds between the first input lead 150_1 and the first input IPD circuit 840A (illustrated with a non-limiting example of three bond wires) may be different than the number of stacked bonds between the second input lead 150_2 and the second input IPD circuit 840B (illustrated with a non-limiting example of two bond wires). It will be understood that the shared bond may be located on either side of the bond connection and that a different number of bond wires may be used.

In some embodiments, non-stacked bonds may be used between the first input IPD circuit 840A and the first transistor circuit 850A and between the second input IPD circuit 840B and the second transistor circuit 850B, though the present disclosure is not limited thereto. In some embodiments, stacked bonds according to any of the embodiments described herein may be used instead.

Referring to the first transistor circuit 850A, non-stacked bond wires may be provided between the first transistor circuit 850A and the first output IPD circuit 845A, and stacked bond wires may be provided between the first transistor circuit 850A and the first output lead 160_1. This configuration is merely an example, and in some embodiments, stacked bonds may also be provided between the first transistor circuit 850A and the first output IPD circuit 845A and/or between the first transistor circuit 850A and the first output lead 160_1.

Referring to the second transistor circuit 850B, the second output IPD circuit 845B_1, 845B_2 may include a plurality of chips and/or integrated circuits utilizing multiple connection configurations Non-stacked bond wires may be provided between the second transistor circuit 850B and the second output IPD circuit 845B_1. This configuration is merely an example, and in some embodiments, stacked bond may also be provided between the second transistor circuit 850B and the second output IPD circuit 845B_1. Stacked bond wires may be provided between the second transistor circuit 850B and the second output IPD circuit 845B_2 and/or between the second output IPD circuit 845B_2 and the second output lead 160_2. As illustrated in FIG. 8E, the configuration of the second output IPD circuits 845B_1, 845B_2 may be different from the configuration of the first output ID circuit 845A.

The configuration of bond wires in FIG. 8E are merely examples, and other configurations of the bond wires, including the use of non-stacked bond wires, could be used alternatively or in addition to the illustrated combinations. FIG. 5E illustrates that different types of stacked bonds can be used in a single package, such as FET amplifier 300''''. The number of bond wires and the placement of the bonds are included to assist in the description and are not intended to limit the present disclosure. More or fewer bonds may be used depending on the requirements of the package. It will be understood that other embodiments of stacked bonds described herein may be utilized without deviating from the disclosure.

Figure 9A:
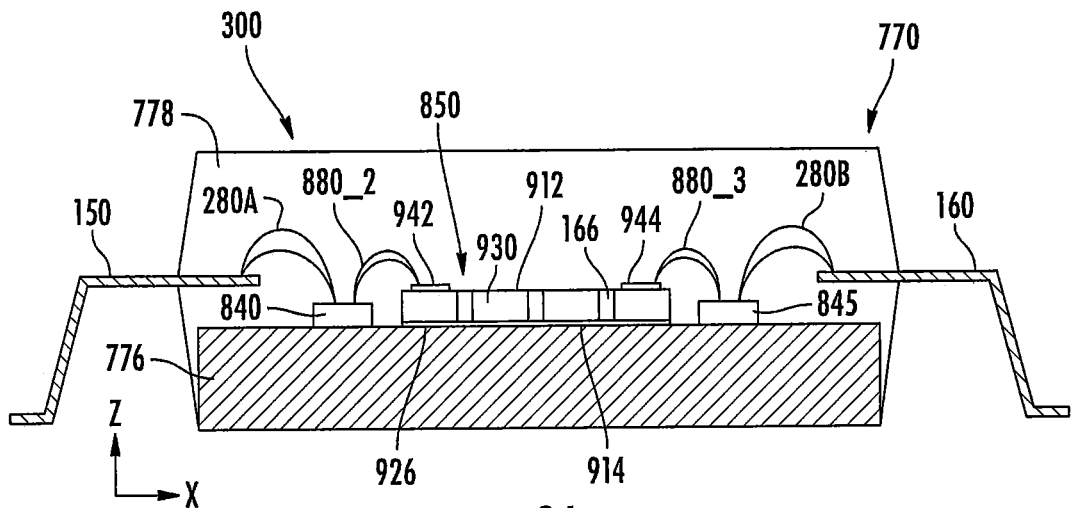
FIGS. 9A and 9B schematically illustrate packaged devices of some embodiments of the present disclosure.
Figure 9B:
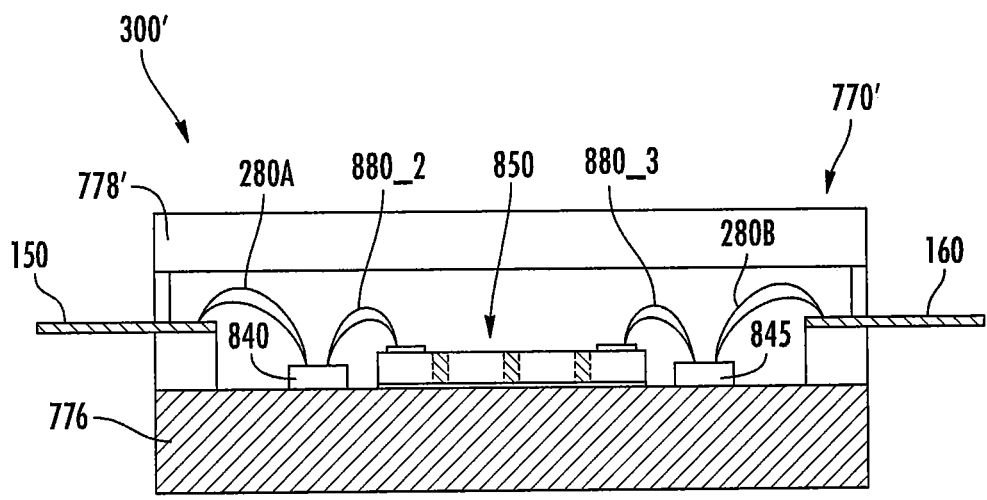

FIGS. 9A and 9B schematically illustrate packaged devices of some embodiments of the present disclosure. It will be appreciated that FIGS. 9A and 9B are highly simplified diagrams intended to represent structures for identification and description and are not intended to represent the structures to physical scale.

As shown in FIG. 9A, the FET power amplifier 300 includes a transistor circuit 850 that is mounted within a package 770, also referred to herein as a packaged transistor device. In some embodiments, the FET power amplifier 300 may be configured to operate with input signals in the RF range, but the embodiments of the present disclosure are not limited thereto. The package 770 includes a submount (also referred to herein as a base or flange) 776 including one or more electrically conductive package leads thereon, for example, one or more input (e.g., gate) leads 150 and one or more output (e.g., drain) leads 160. The transistor circuit 850 is mounted on the upper surface of the submount 776. The submount 776 may be or may include an electrically conductive attachment surface, for example, a metal substrate (or "slug") that acts as a thermally conductive heat sink. In some embodiments, the submount 776 may additionally or alternatively include a redistribution layer (RDL) laminate structure including conductive layers fabricated using semiconductor processing techniques, a printed circuit board with metal traces, and/or a ceramic substrate that includes electrically conductive vias and/or pads. In some embodiments, a metal lead frame may be formed and then processed to provide the metal submount 776 and/or the package leads (e.g., gate and drain leads) 150 and 160. FET power amplifier 300 also includes housing 778 (e.g., a plastic overmold) that at least partially surrounds the transistor circuit 850, the package leads 150, 160 and the metal submount 776.

The transistor circuit 850 has a top side 912 and a bottom side 914. The transistor circuit 850 includes a bottom side (also referred to as a "back" side) metallization structure, a semiconductor layer structure 930 and a top side metallization structure that are sequentially stacked. The back side metallization structure includes a metal source terminal 926. FET power amplifier 300 may be a HEMT-based transistor amplifier, in which case the semiconductor layer structure 930 may include at least a channel layer and a barrier layer, which are typically formed on a substrate. The substrate may be a semiconductor or insulating growth substrate (such as a SiC or sapphire substrate). The growth substrate, even if formed of a non-semiconductor material, may be considered to be part of the semiconductor layer structure 930. Herein, the term "semiconductor layer structure" refers to a structure that includes one or more semiconductor layers, for example, semiconductor substrates and/or semiconductor epitaxial layers. The top side metallization structure includes, among other things, a metal gate terminal 942 and a metal drain terminal 944.

Input IPD circuits 840 and/or output IPD circuits 845 may also be mounted within the package 770. The IPD circuits 840, 845 may be impedance matching circuits that match the impedance of the fundamental component of signals input to or output from the FET power amplifier 300 to the impedance at the input or output of the transistor circuit 850, respectively, and/or harmonic termination circuits that are configured to short to ground harmonics of the fundamental frequencies of the signals that may be present at the input or output of the transistor circuit 850, such as second order or third order harmonics. As schematically shown in FIG. 9A, the input and output IPD circuits 840, 845 may be mounted on the metal submount 776. The gate lead 150 may be connected to the input IPD circuit 840 by the first plurality of bond wires 280A and/or one or more first bond wires 880_1 (see FIG. 8) and the input IPD circuit 840 may be connected to the gate terminal 942 of the transistor circuit 850 by one or more second bond wires 880_2. Similarly, the drain lead 160 may be connected to the output IPD circuit 845 by the second plurality of bond wires 280B and/or one or more fourth bond wires 880_4 (see FIG. 8), and the output IPD circuit 845 may be connected to the drain terminal 944 of the transistor circuit 850 by one or more third bond wires 880_3. The source terminal 926 of the transistor circuit 850 may be mounted directly on the metal submount 776. The metal submount 776 may provide the electrical connection to the source terminal 926 and may also serve as a heat dissipation structure. The gate lead 150 and the drain lead 160 may extend through the housing 778.

The first plurality of bond wires 280A, the first bond wires 880_1 (see FIG. 8), the second bond wires 880_2, the third bond wires 880_3, the fourth bond wires 880_4 (see FIG. 8), and/or the second plurality of bond wires 280B may be implemented using stacked bonds according to any embodiment, or a combination of the embodiments, described herein.

While FIG. 9A illustrates a package 770 incorporating a plastic overmold 778, the embodiments of the present disclosure are not limited to such a package configuration. FIG. 9B is a schematic side view of another example of a packaged FET power amplifier 300 that is similar to the FET power amplifier 300 discussed above with reference to FIG. 9A. FET power amplifier 300' differs from FET power amplifier 300 of FIG. 9A in that it includes a different package 770'. The package 770' includes the metal submount 776 (which acts as a metal heat sink and can be implemented as a metal slug), as well as gate and drain leads 150, 160. In some embodiments, a metal lead frame may be formed that is then processed to provide the metal submount 776 and/or the gate and drain leads 150, 160. FET power amplifier 300' also includes a housing 778' that at least partially surrounds the transistor circuit 850, the leads 150, 160 and the metal submount 776. The housing 778' may comprise a ceramic housing in some embodiments, and the gate lead 150' and the drain lead 160' may extend through the housing 778'. In some embodiments, the housing 778' may comprise plastic and/or a printed circuit board. The housing 778' may comprise multiple pieces, such as a frame that forms the lower portion of the sidewalls and supports the gate and drain leads 150, 160, and a lid that is placed on top of the frame. The interior of the device may comprise an air-filled cavity. The sidewalls and lid of the housing 778' of FIG. 9B replace the plastic overmold 778 included in FET power amplifier 300 illustrated in FIG. 9A.

Figure 10:
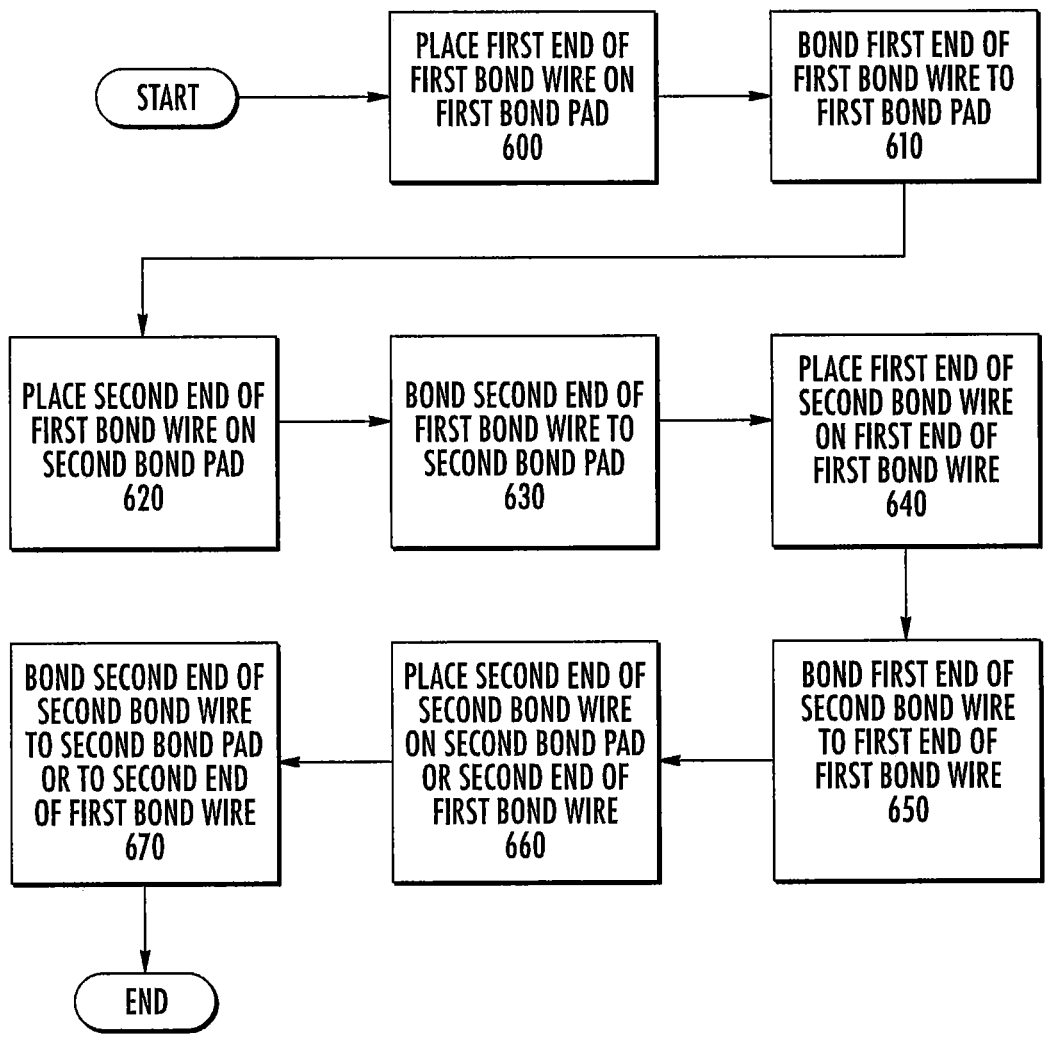
FIG. 10 is a flow chart of a method of bonding a bond wire according to some embodiments of the present invention.

FIG. 10 is a flow chart of a method of bonding a bond wire according to some embodiments of the present invention. As shown in FIG. 10, operations may begin with placing a first end of a first bond wire on a first bond pad (block 600). For example, as illustrated in FIGS. 2A to 2E, a first end 281 of a first bond wire 280_1 may be placed on a first bond pad such as output pad 225.

The first end of the first bond wire may be bonded to the first bond pad (block 610). In some embodiments, the bonding of the first bond wire to the first bond pad may include the application of a first pressure to form the bond. The bonding of the first bond wire may, in some embodiments, compress a thickness of the first bond wire. The application of the first pressure may form a first bonding portion of the first bond wire that contacts the first bond pad.

A second end of the first bond wire may be placed on a second bond pad (block 620) and bonded to the second bond pad (block 630). For example, as illustrated in FIGS. 2A to 2E, a second end 282 of a first bond wire 280_1 may be placed and bonded on a second bond pad such as output lead pad 165.

A first end of a second bond wire may be placed on the first end of the first bond wire (block 640). For example, as illustrated in FIGS. 2A to 2E, a first end 281 of a second bond wire 280_2 may be placed on the first end 281 of the first bond wire 280_1.

The first end of the second bond wire may be bonded to the first end of the first bond wire (block 650). In some embodiments, the bonding of the second bond wire to the first end of the first bond wire may include the application of a second pressure to form the bond. In some embodiments, the second pressure may be less than the first pressure. The bonding of the second bond wire may, in some embodiments, compress a thickness of the second wire and the first bond wire. The application of the second pressure may form a second bonding portion of the second bond wire that contacts the first bonding portion of the first bond wire. In some embodiments, the application of the second pressure may cause a first thickness of the first bonding portion of the first bond wire to be smaller than a second thickness of the second bonding portion of the second bond wire.

The second end of the second wire may be placed on the second bond pad or on the F second end of the first bond wire (block 660) and bonded to the second bond pad or on the second end of the first bond wire (block 670). For example, as illustrated in FIG. 2B, the second end 282 of the second bond wire 280_2 may be bonded to a second bond pad such as output lead pad 165 at a point that is separated from the second end of the first bond wire 280_1 by a distance D. As another example, as illustrated in FIG. 5A, the second end 282 of the second bond wire 280_2 may be bonded on the second end 282 of the first bond wire 280_1.

In some embodiments, a third bond wire may be bonded to an upper surface of the second end of the second bond wire. For example, as illustrated in FIG. 5D, a second end 282 of a third bond wire 280_3 may be bonded on the second end 282 of the second bond wire 280_2.

As will be understood by one of ordinary skill in the art, the method illustrated in FIG. 10 may be modified to generate any of the embodiments of the present disclosure described herein.

Various embodiments have been described herein with reference to the accompanying drawings in which example embodiments are shown. These embodiments may, however, be embodied in different forms and should not be construed as limited to the embodiments set forth herein. Rather, these embodiments are provided so that this disclosure is thorough and complete and fully conveys the inventive concept to those skilled in the art. Various modifications to the example embodiments and the generic principles and features described herein will be readily apparent. In the drawings, the sizes and relative sizes of layers and regions are not shown to scale, and in some instances may be exaggerated for clarity.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on," "attached," or extending "onto" another element, it can be directly on the other element or intervening elements may also be present. In contrast, when an element is referred to as being "directly on" or "directly attached" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Elements illustrated by dotted lines may be optional in the embodiments illustrated.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. A packaged semiconductor device comprising:
   a first bond wire comprising a first end and a second end; and
   a second bond wire comprising a first end and a second end, wherein the first end of the second bond wire is bonded to a surface of the first end of the first bond wire,
   wherein the first end of the second bond wire and the first end of the first bond wire comprise respective widths in a horizontal direction or respective thicknesses in a vertical direction that differ from one another, and
   wherein an operating frequency of the packaged semiconductor device is between 500 MHz and 75 GHz.

2. The packaged semiconductor device of claim 1, wherein the second end of the second bond wire is bonded to a surface of the second end of the first bond wire.

3. The packaged semiconductor device of claim 1, wherein the second end of the second bond wire is bonded to a contact surface of a pad.

4. The packaged semiconductor device of claim 3, wherein the second end of the first bond wire is bonded to the contact surface of the pad, and
   wherein the second end of the first bond wire is separated from the second end of the second bond wire.

5. The packaged semiconductor device of claim 1, further comprising a monolithic microwave integrated circuit (MMIC).

6. A packaged semiconductor device comprising:
   a first bond wire comprising a first end and a second end; and
   a second bond wire comprising a first end and a second end, wherein the first end of the second bond wire comprises a second bonding portion that is bonded to a surface of a first bonding portion of the first end of the first bond wire,
   wherein a thickness of the first bonding portion of the first bond wire in a vertical direction is smaller than a thickness of the second bonding portion of the second bond wire in the vertical direction.

7. The packaged semiconductor device of claim 6, wherein the first bonding portion is bonded to a contact surface of a pad.

8. The packaged semiconductor device of claim 6, wherein an operating frequency of the packaged semiconductor device is between 500 MHz and 75 GHz.

9. The packaged semiconductor device of claim 6, wherein the second bond wire comprises a round wire comprising a predominantly round cross-section.

10. The packaged semiconductor device of claim 9, wherein the first bond wire comprises a wire ribbon comprising a predominantly rectangular cross-section.

11. The packaged semiconductor device of claim 7, wherein a width of the first bonding portion of the first bond wire in a horizontal direction is greater than a width of the second bonding portion of the second bond wire in the horizontal direction.

12. The packaged semiconductor device of claim 6, wherein greater than twenty-five percent of a circumference of the second bond wire contacts the surface of the first end of the first bond wire or greater than twenty-five percent of a circumference of the first bond wire contacts a surface of the second bond wire.

13. The packaged semiconductor device of claim 6, further comprising a third bond wire comprising a first end and a second end, wherein the second end of the third bond wire is bonded to the second end of the second bond wire.

14. A packaged semiconductor device comprising:
a first bond pad;
a second bond pad;
a first bond wire comprising a first end bonded to the first bond pad and a second end bonded to the second bond pad; and
a second bond wire comprising a first end that is electrically connected to the first bond pad and a second end that is electrically connected to the second bond pad, wherein the first end of the second bond wire is bonded to the first end of the first bond wire,
wherein the first end of the second bond wire and the first end of the first bond wire comprise respective widths in a horizontal direction or respective thicknesses in a vertical direction that differ from one another, and
wherein an operating frequency of the packaged semiconductor device is between 500 MHz and 75 GHz.

15. The packaged semiconductor device of claim 14, wherein the second end of the second bond wire is bonded to a surface of the second end of the first bond wire.

16. The packaged semiconductor device of claim 14, wherein the second end of the second bond wire is bonded to the second bond pad.

17. The packaged semiconductor device of claim 16, wherein the second end of the first bond wire is separated from the second end of the second bond wire.

18. The packaged semiconductor device of claim 14, further comprising a monolithic microwave integrated circuit (MMIC).

19. A packaged semiconductor device comprising:
a first bond pad;
a second bond pad;
a first bond wire comprising a first end bonded to the first bond pad and a second end bonded to the second bond pad; and
a second bond wire comprising a first end that is electrically connected to the first bond pad and a second end that is electrically connected to the second bond pad, wherein the first end of the second bond wire comprises a second bonding portion that is bonded to a first bonding portion of the first end of the first bond wire,
wherein a width of the first bonding portion of the first bond wire in a horizontal direction is greater than a width of the second bonding portion of the second bond wire in the horizontal direction.

20. The packaged semiconductor device of claim 19, wherein the first bonding portion is bonded to the first bond pad.

21. The packaged semiconductor device of claim 19, wherein an operating frequency of the packaged semiconductor device is between 500 MHz and 75 GHz.

22. The packaged semiconductor device of claim 19, wherein the second bond wire comprises a round wire comprising a predominantly round cross-section.

23. The packaged semiconductor device of claim 22, wherein the first bond wire comprises a wire ribbon comprising a predominantly rectangular cross-section.

24. The packaged semiconductor device of claim 20, wherein a thickness of the first bonding portion of the first bond wire in a vertical direction is smaller than a thickness of the second bonding portion of the second bond wire in the vertical direction.

25. The packaged semiconductor device of claim 19, wherein greater than fifty percent of a lower surface of the second bond wire contacts an upper surface of the first bond wire or greater than fifty percent of the upper surface of the first bond wire contacts the lower surface of the second bond wire.

26. The packaged semiconductor device of claim 19, further comprising a third bond wire comprising a first end that is electrically connected to the first bond pad and a second end that is electrically connected to the second bond pad,
wherein the second end of the third bond wire is bonded to the second end of the second bond wire.

27. The packaged semiconductor device of claim 19, further comprising an input lead, wherein one of the first bond pad or the second bond pad is electrically coupled between the first bond wire and the input lead.

28. The packaged semiconductor device of claim 19, further comprising an output lead, wherein one of the first bond pad or the second bond pad is electrically coupled between the first bond wire and the output lead.

29. A method of bonding a bond wire comprising:
bonding a first end of a first bond wire to a contact surface of a first bond pad; and
bonding a first end of a second bond wire to a surface of the first end of the first bond wire by placing the first end of the second bond wire on the surface of the first end of the first bond wire and applying a second pressure to the first end of the second bond wire.

30. The method of claim 29, wherein bonding the first end of the first bond wire to the contact surface of the first bond pad comprises placing the first end of the first bond wire on the contact surface and applying a first pressure to the first end of the first bond wire.

31. The method of claim 30, wherein the second pressure is less than the first pressure.

32. The method of claim 29, further comprising bonding a second end of the second bond wire to a surface of a second end of the first bond wire.

33. The method of claim 29, further comprising bonding a second end of the second bond wire to a contact surface of a second bond pad.

34. The method of claim 33, wherein the second end of the second bond wire is bonded at a point that is separated from the second end of the first bond wire.

35. The method of claim 29, further comprising bonding a third bond wire to a surface of a second end of the second bond wire.

36. The method of claim 29, wherein at least one of the first bond wire and the second bond wire comprises a round wire comprising a predominantly round cross-section.

37. The method of claim 29, wherein at least one of the first bond wire and the second bond wire comprises a wire ribbon comprising a predominantly rectangular cross-section.

* * * * *

UNITED STATES PATENT AND TRADEMARK OFFICE
CERTIFICATE OF CORRECTION

| | |
|---|---|
| PATENT NO. | : 11,908,823 B2 |
| APPLICATION NO. | : 17/145794 |
| DATED | : February 20, 2024 |
| INVENTOR(S) | : Orejola et al. |

It is certified that error appears in the above-identified patent and that said Letters Patent is hereby corrected as shown below:

In the Specification

Column 5, Line 26: Please correct "FIGS. 8A to SE" to read --FIGS. 8A to 8E--

Column 11, Line 41: Please correct "FIGS. 5A to SC" to read --FIGS. 5A to 5C--

Column 12, Line 27: Please correct "280I" to read --280_1--

Column 15, Line 18: Please correct "MIC" to read --MMIC--

Column 20, Line 47: Please correct "FIG. 5E" to read --FIG. 8E--

Column 20, Line 50: Please correct "FIG. 5E" to read --FIG. 8E--

Column 20, Line 56: Please correct "FIG. 5E" to read --FIG. 8E--

Column 20, Line 67: Please correct "FBT" to read --FET--

Column 21, Line 12: Please correct "FIG. B" to read --FIG. 8E--

Column 21, Line 59: Please correct "FIG. 5E" to read --FIG. 8E--

Column 23, Line 27: Please correct "300" to read --300'--

Signed and Sealed this
Fifteenth Day of October, 2024

Katherine Kelly Vidal
*Director of the United States Patent and Trademark Office*